(12) United States Patent
Shan et al.

(10) Patent No.: US 12,347,787 B2
(45) Date of Patent: Jul. 1, 2025

(54) THREE DIMENSIONAL (3D) MEMORY DEVICE AND FABRICATION METHOD

(71) Applicant: Yangtze Memory Technologies Co., Ltd., Wuhan (CN)

(72) Inventors: Chuanhai Shan, Wuhan (CN); Zhaosong Li, Wuhan (CN); Zhouyang Lu, Wuhan (CN); Jing Liu, Wuhan (CN); Jing Gao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 418 days.

(21) Appl. No.: 17/838,964

(22) Filed: Jun. 13, 2022

(65) Prior Publication Data

US 2023/0402394 A1    Dec. 14, 2023

(51) Int. Cl.
| | |
|---|---|
| *H01L 23/544* | (2006.01) |
| *H01L 23/00* | (2006.01) |
| *H01L 25/00* | (2006.01) |
| *H01L 25/065* | (2023.01) |
| *H01L 25/18* | (2023.01) |

(52) U.S. Cl.
CPC ............ *H01L 23/544* (2013.01); *H01L 24/08* (2013.01); *H01L 24/80* (2013.01); *H01L 25/0657* (2013.01); *H01L 25/18* (2013.01); *H01L 25/50* (2013.01); *H01L 2223/54426* (2013.01); *H01L 2224/08145* (2013.01); *H01L 2224/8013* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ....... H01L 23/544; H01L 24/08; H01L 24/80; H01L 25/0657; H01L 25/18; H01L 2223/54426; H01L 2224/08145; H01L 2224/8013; H01L 2924/1431; H01L 2924/14511; H10B 43/50
See application file for complete search history.

(56) References Cited

U.S. PATENT DOCUMENTS

| | | | |
|---|---|---|---|
| 2005/0186756 A1* | 8/2005 | Yabe | ............ H01L 23/544 |
| | | | 257/E23.179 |
| 2015/0236142 A1* | 8/2015 | Laven | ............ H01L 21/02639 |
| | | | 257/66 |

* cited by examiner

*Primary Examiner* — Thanh Y. Tran
(74) *Attorney, Agent, or Firm* — Anova Law Group, PLLC

(57) ABSTRACT

Three-dimensional (3D) NAND memory devices and methods are provided. A fabrication method includes forming a semiconductor layer over a substrate, forming an opening that extends partially through the semiconductor layer, depositing a first stack layer and a second stack layer that are alternately stacked over a sidewall of the opening and over the semiconductor layer, and filling the opening with a dielectric material to form an alignment mark.

20 Claims, 18 Drawing Sheets

THREE DIMENSIONAL (3D) MEMORY DEVICE AND FABRICATION METHOD

FIELD OF THE TECHNOLOGY

This application relates generally to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Alignment marks are frequently used in NAND manufacturing, such as in patterning and etching processes. When a successive layer is aligned to a previous layer, the alignment can be performed using alignment marks embedded in a layer underneath. In some cases, alignment marks introduce defects that affect the reliability of NAND memory devices.

SUMMARY

In one aspect of the present disclosure, a method for fabricating a semiconductor device includes providing a substrate, forming a semiconductor layer including a semiconductor material over the substrate, forming a first opening that extends partially through the semiconductor layer along a direction approximately perpendicular to the substrate, depositing a first stack layer and a second stack layer that are alternately stacked over a sidewall of the first opening and over the semiconductor layer, and filling the first opening that is partially filled by the first stack layer and second stack layer with a predetermined dielectric material to form an alignment mark for fabricating the semiconductor device. The first stack layer and second stack layer partially fill the first opening.

In another aspect of the present disclosure, a semiconductor device includes a semiconductor layer including a semiconductor material, and a portion of an alignment mark. The portion of the alignment mark includes a dielectric material, and extends partially through the semiconductor layer. The portion of the alignment mark includes a first stack layer and a second stack layer that are alternately stacked.

In another aspect of the present disclosure, a three-dimensional (3D) memory device includes a semiconductor layer including a semiconductor material, a conductive layer including a conductive material formed at a level over the semiconductor layer, a conductor/insulator stack formed over the conductive layer, and a structure of an alignment mark. The structure of the alignment mark is formed between the semiconductor layer and a dielectric layer and between a level of the conductive layer and a level of the semiconductor layer, and extends partially through the semiconductor layer.

In another aspect of the present disclosure, a system includes a memory device and a memory controller for controlling the memory device. The memory device includes a semiconductor layer including a semiconductor material, a conductive layer including a conductive material formed over the semiconductor layer, a conductor/insulator stack formed over the conductive layer, and a structure of an alignment mark. The structure of the alignment mark is formed between the semiconductor layer and a dielectric layer, and between a level of the conductive layer and a level of the semiconductor layer, and extends partially through the semiconductor layer.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1A, 1B, 2-11, 12A, 12B, and 13-21 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or along a line in the X-Y plane.

Figure 1A:
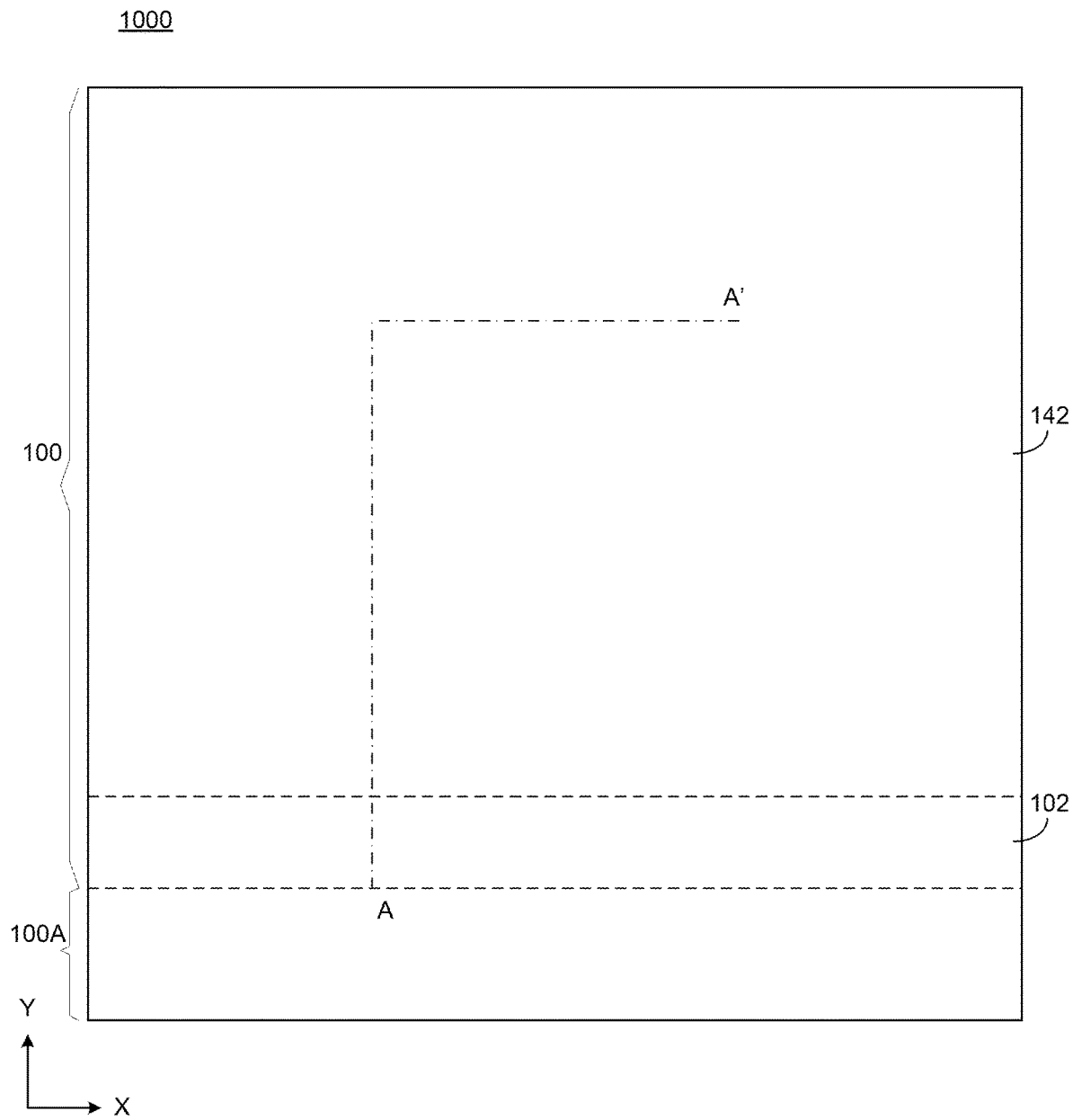
FIGS. 1A and 1B illustrate a top view of an exemplary structure and a cross-sectional view of an exemplary three-dimensional (3D) array device at a certain stage during a fabrication process according to various aspects of the present disclosure.
Figure 1B:
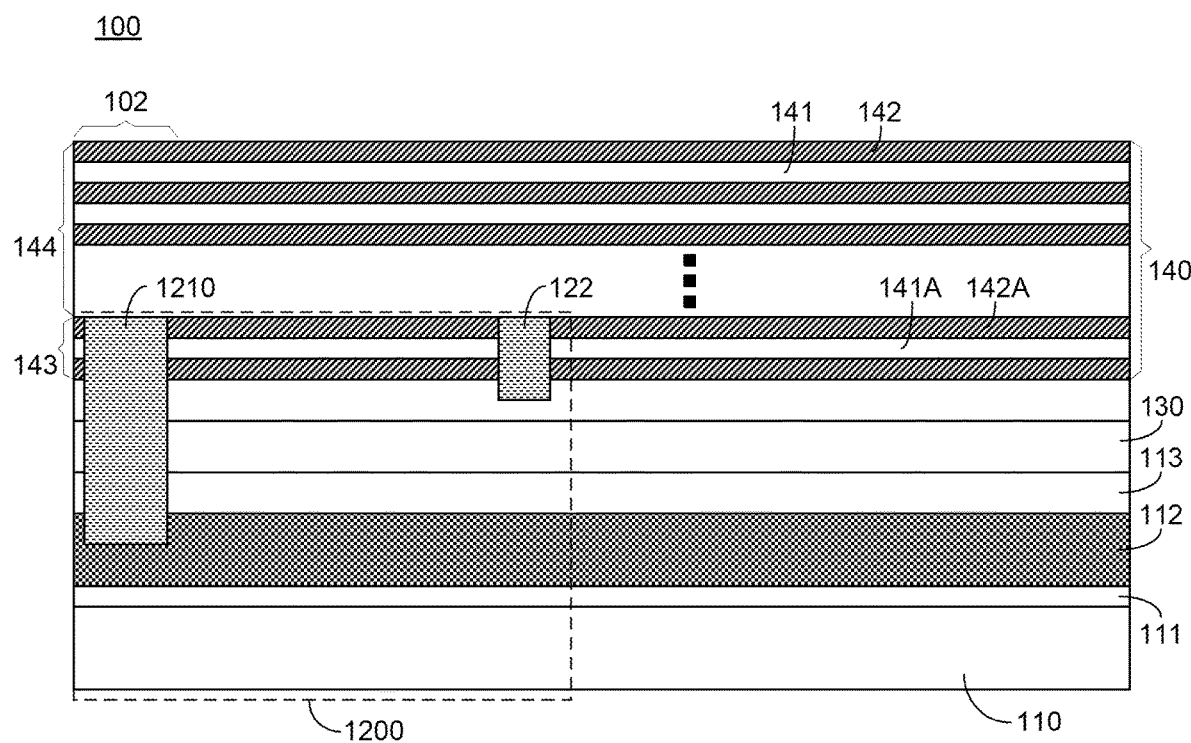

FIGS. 1A and 1B illustrate a top view of an exemplary structure 1000 and a cross-sectional view of the 3D array device 100 at a certain stage during a fabrication process. The cross-sectional view shown in FIG. 1B is taken along a line AA' of FIG. 1A. The structure 1000 may contain multiple 3D array devices including 3D array devices 100 and 100A. In some embodiments, the 3D array devices 100 and 100A may have similar structures. As depicted in FIG. 1A, only a small portion of the 3D array device 100A is displayed. Assuming that the 3D array device 100 includes a non-functional region 102 that may be used for arranging a dicing street (or scribe line) that separates the devices 100 and 100A. The region 102 may also be used for arranging certain non-functional structures such as alignment marks.

As shown in FIG. 1B, the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a dielectric layer 111 with a dielectric material (e.g., silicon oxide) is deposited over the substrate 110. A semiconductor layer 112 with a semiconductor material such as polysilicon is deposited over the dielectric layer 111. A dielectric layer 113 with a dielectric material (e.g., silicon oxide) is deposited over the semiconductor layer 112. Further, a sacrificial layer 130 is deposited over the dielectric layer 113. The sacrificial layer 130 may include a dielectric material, a semiconductor material, or a conductive material. The word "conductive", as used herein, indicates electrically conductive. An exemplary material for the sacrificial layer 130 is polysilicon. The layers 111-130 may be deposited by chemical vapor deposition (CVD), physical vapor deposition (PVD), atomic layer deposition (ALD), or a combination thereof.

Further, over the sacrificial layer 130, a dielectric stack 143 is formed. In some aspects, the dielectric stack 143 includes multiple pairs of stack layers, for example, including first dielectric layers 141A and second dielectric layers 142A that are alternately stacked over one another. The dielectric stack 143 corresponds to a region of the bottom select gate (BSG). The dielectric stack 143 may include one or more pairs of the stack layers.

Further, over the dielectric stack 143, a dielectric stack 144 is formed. The dielectric stack 144 includes multiple pairs of stack layers, for example, including first dielectric layers 141 and second dielectric layers 142, stacked alternately over each other. Some layers of the dielectric stack 144 are used to form memory cells. In some cases, the layers for fabricating memory cells may include 64 pairs, 128 pairs, or more than 128 pairs of the first and second dielectric layers 141 and 142.

In some aspects, the first dielectric layers 141 and second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer.

In some cases, the dielectric stacks 143 and 144 may contain the same stack layers. In such cases, the first dielectric layers 141 and 141A contain the same material, and the second dielectric layers 142 and 142A also contain the same material. Optionally, the dielectric stacks 143 and 144 may contain different stack layers. For example, the first dielectric layers 141 may contain a material different from that of the layer 141A and 142A. In descriptions below, as an example, the dielectric stacks 143 and 144 contain the same stack layers or contain stack layers of the same materials. Further, as an example, the stacks 143 and 144 together are referred to as a dielectric stack 140. That is, the dielectric stack 140 contains the stacks 143 and 144. The dielectric stacks may be formed via CVD, PVD, ALD, or a combination thereof.

In some aspects, an alignment mark 1210 and a BSG cut 122 are formed after the stack 143 is made and before the stack 144 is deposited. A BSG cut may also be referred to as a BSG cut structure as used herein. As shown in FIG. 1B, the alignment mark 1210 and BSG cut 122 are arranged in an exemplary portion 1200 of the 3D array device 100. The alignment mark 1210 extends through the layers 142A, 141A, 130, and 113, and partially through the layer 112 along the Z direction or a direction approximately perpendicular to the substrate 110. Optionally, the alignment mark 1210 may penetrate the semiconductor layer 112 by a distance that is, for example, smaller than one third or half of the thickness of the layer 112. In some embodiments, the alignment mark 1210 is configured in the non-functional region 102. The region 102 may be arranged for laying out a dicing street (or scribe line) in some cases. The BSG cut 122 extends through the layers 142A and 141B along the Z direction or a direction approximately perpendicular to the substrate 110. In some cases, the BSG cut 122 may partially extend through the layer 130 along the Z direction. More details about fabricating the alignment mark and BSG cut are schematically illustrated in FIGS. 2-11 and descriptions below.

Figure 2:
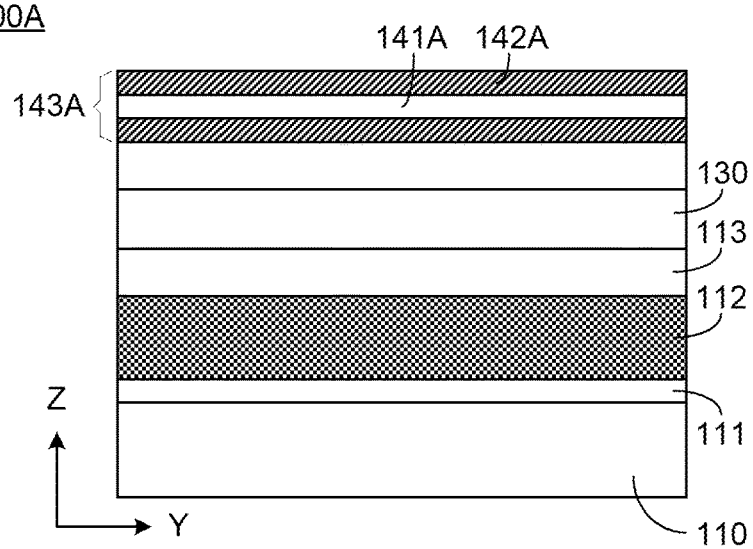
FIGS. 2-11 are cross-sectional views of a portion of the 3D array device shown in FIG. 1B illustrating methods to form an alignment mark and bottom select gate (BSG) cut during the fabrication process according to various aspects of the present disclosure.
Figure 3:
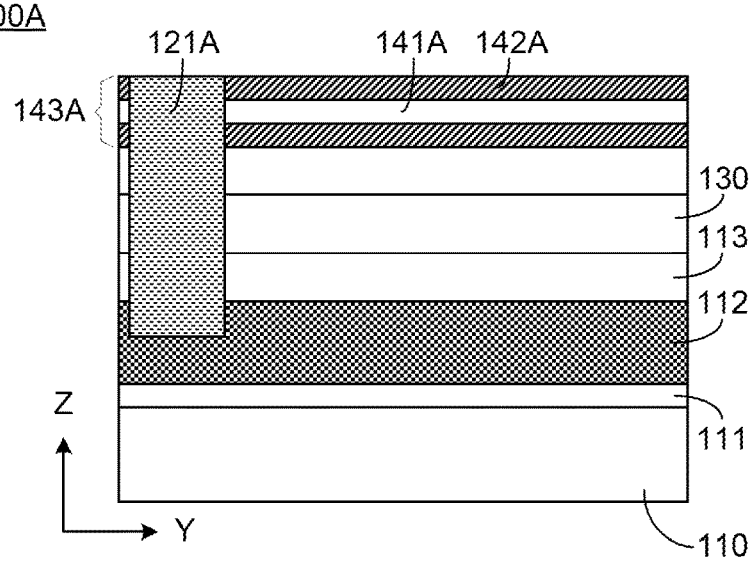
Figure 4:
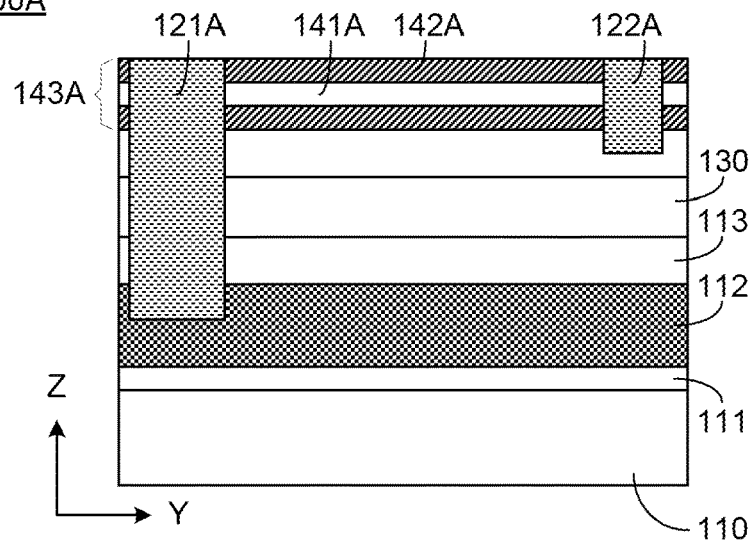

FIGS. 2-4 show cross-sectional views 1200A of the portion 1200 depicted in FIG. 1B according to aspects of the present disclosure. A dielectric stack 143A with stack layers 141A and 142A corresponds to the dielectric stack 143 shown in FIG. 1B. As illustrated in FIG. 2, the dielectric stack 143A is deposited over the sacrificial layer 130. Similar to the stack 143, the dielectric stack 143A may have one or more pairs of the stack layers 141A and 142A. An opening may be etched by a dry etch process or a combination of dry and wet etch processes, and subsequently filled with a dielectric material (e.g., silicon oxide) to form an alignment mark 121A. As shown in FIG. 3, the alignment mark 121A extends through the dielectric stack 143A with the layers 141A and 142A, the layers 130 and 113, and partially through the layer 112 along the Z direction. Further, as shown in FIG. 4, another opening may be etched by a dry etch process or a combination of dry and wet etch processes, and subsequently filled with a dielectric material (e.g., silicon oxide) to form a BSG cut 122A. The BSG cut 122A extends through the dielectric stack 143A with the layers 142A and 141A along the Z direction. Optionally, the BSG cut 122A may partially extend through the layer 130. In some embodiments, openings for the alignment mark 121A and BSG cut 122A may be etched separately, but filled with a dielectric material to form the alignment mark 121A and BSG cut 122A at the same time.

Figure 5:
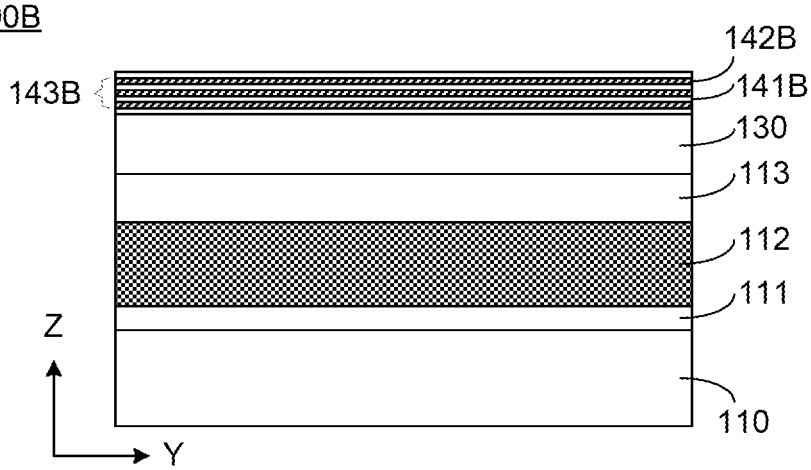
Figure 6:
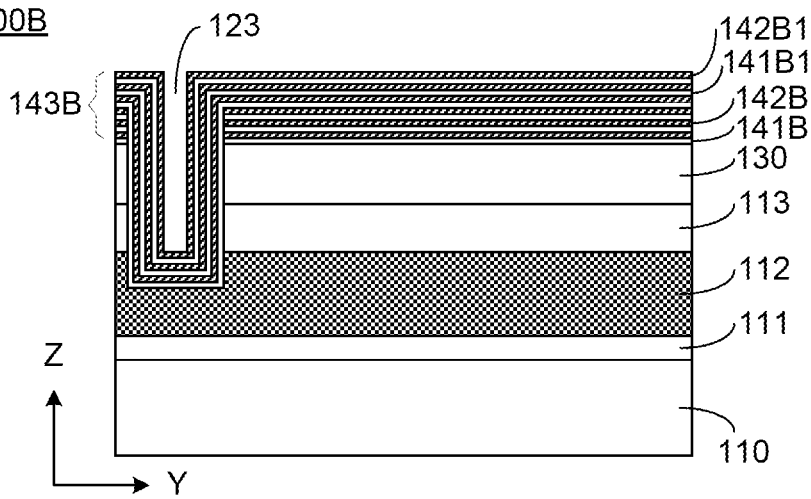
Figure 7:
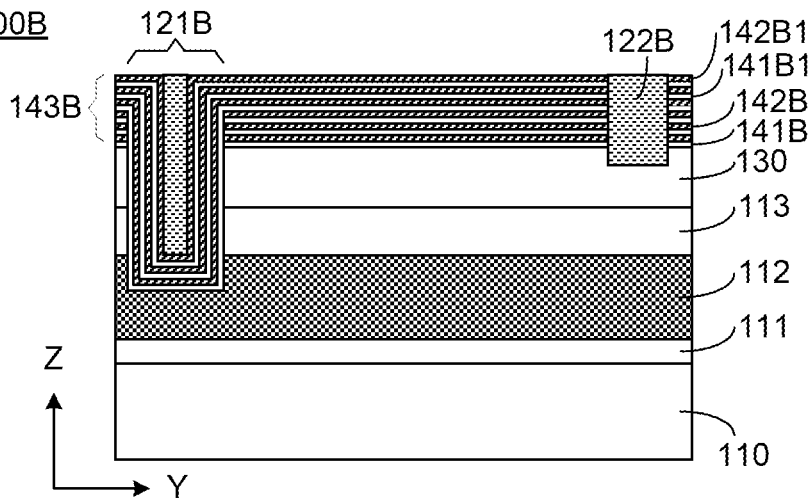

FIGS. 5-7 show cross-sectional views 1200B of the portion 1200 depicted in FIG. 1B according to aspects of the present disclosure. A dielectric stack 143B with stack layers 141B and 142B corresponds to the dielectric stack 143 with the stack layers 141A and 142A shown in FIG. 1B. As illustrated in FIG. 5, the dielectric stack 143B is deposited over the sacrificial layer 130. Similar to the stack 143, the dielectric stack 143B may have one or more pairs of the stack layers 141B and 142B. For example, the dielectric stack 143B may have four pairs of the stack layers 141B and 142B in some cases. Optionally, the stack layers 141B and 142B may have the same dielectric material as that of the stack layers 141A and 142A, respectively. Further, an opening 123 is etched by a dry etch process or a combination of dry and wet etch processes for forming an alignment mark 121B. The opening 123 may extend through the dielectric stack 143B with the layers 141B and 142B, the layers 130 and 113, and partially through the layer 112 along the Z direction. Further, one or more pairs of stack layers 141B1 and 142B1 are deposited over the stack layers 141B and 142B, the sidewall of the opening 123, and the bottom surface of the opening 123, as depicted in FIG. 6. For example, in some cases, three pairs of the stack layers 141B1 and 142B1 may be formed. The dielectric stack 143B becomes thicker after the layers 141B1 and 142B2 are added to it, and the opening 123 is partially filled by a portion of the dielectric stack 143B (i.e., the stack layers 141B1 and 142B1 on the sidewall and bottom surface of the opening 123). Similar to the stack layers 141B and 142B, the stack layers 141B1 and 142B1 are alternately stacked over each other. In some embodiments, the stack layers 141A, 141B, and 141B1 may contain the same dielectric material, and the stack layers 142A, 142B, and 142B1 may contain the same dielectric material, too. In some cases, the stack layers 141A, 141B, and 141B1 may contain different materials, while the stack layers 142A, 142B, and 142B1 may contain the same material and work as sacrificial stack layers.

Further, another opening is etched by a dry etch process or a combination of dry and wet etch processes for forming a BSG cut 122B. The two openings are subsequently filled with a dielectric material (e.g., silicon oxide) to form the alignment mark 121B and BSG cut 122B in the same time period. As shown in FIG. 7, the alignment mark 121B passes through a level of the stack layers 141B1 and 142B1, extends through the stack layers 141B and 142B, the layer 130, and the layer 113, and partially extends through the layer 112 along the Z direction. The level of the stack layers 141B1 and 142B1 is in an X-Y plane and positioned along the Z direction or a direction approximately perpendicular to the substrate 110. The alignment mark 121B has a sidewall that is approximately perpendicular to the substrate 110, and contains a portion of the stack 143B (i.e., one or more pairs of the stack layers 141B1 and 142B1). The BSG cut 122B extends through the dielectric stack 143B with the layers 142B1, 141B1, 142B, and 141B along the Z direction. The BSG cut 122B may partial extend through the layer 130 in some cases.

Figure 8:
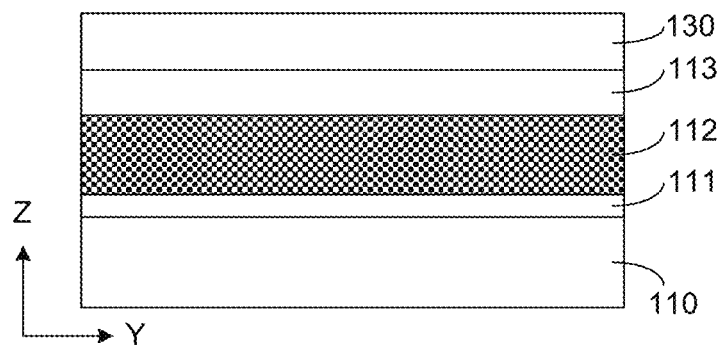
Figure 9:
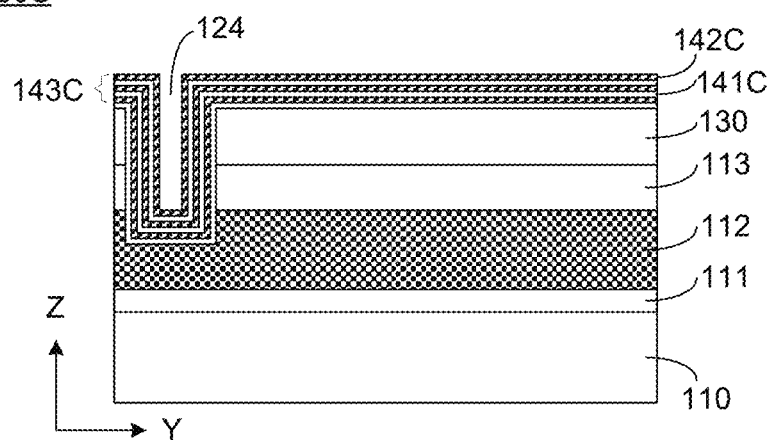
Figure 10:
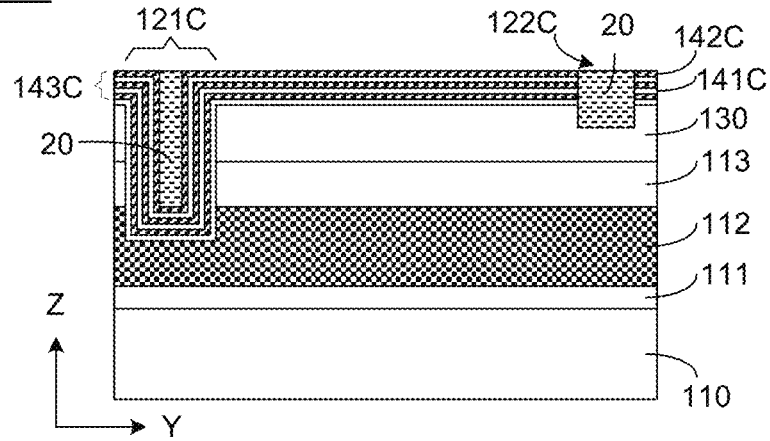

FIGS. 8-10 show cross-sectional views 1200C of the portion 1200 depicted in FIG. 1B according to aspects of the present disclosure. A dielectric stack 143C with stack layers 141C and 142C corresponds to the dielectric stack 143 with the stack layers 141A and 142A as shown in FIG. 1B. FIG. 8 reflects a structural diagram after the sacrificial layer 130 is deposited over the dielectric layer 113. As shown in FIG. 9, an opening 124 is formed by a dry etch process or a combination of dry and wet etch processes for making an alignment mark 121C. The opening 124 may extend through the layers 130 and 113, and partially through the layer 112 along the Z direction or a direction approximately perpendicular to the substrate 110. Further, the stack layers 141C and 142C may be deposited by CVD and/or ALD. The layers 141C and 142C, stacked alternately over one another, form the dielectric stack 143C over the sacrificial layer 130. A portion of the dielectric stack 143C is deposited on the sidewall and bottom surface of the opening 124. As such, the opening 124 is partially filled by the portion of the dielectric stack 143C (i.e., the stack layers 141C and 142C on the sidewall and bottom surface of the opening 124). In certain embodiments, the dielectric stack 143C may have one or more pairs of the stack layers 141C and 142C that are alternately stacked. For example, the dielectric stack 143C may optionally have three to seven pairs of the stack layers 141C and 142C. The stack layers 141C and 142C may contain different dielectric materials. In some cases, the stack layer 141C may be an isolation stack layer, while the stack layer 142C may be a sacrificial stack layer. Optionally, the stack layers 141C and 142C may have the same dielectric material as that of the stack layers 141A and 142A, respectively. Alternatively, the stack layers 141C and 141A may have different materials, while the stack layers 142C and 142A may have the same material.

Further, another opening is etched by a dry etch process or a combination of dry and wet etch processes for a BSG cut 122C. The opening for BSG cut 122C may extend through the dielectric stack 143 and reach or partially penetrate the layer 130. The two openings may be subsequently filled with a dielectric material 20 (e.g., silicon oxide) to form the alignment mark 121C and BSG cut 122C at the same time. As shown in FIG. 10, the alignment mark 121C passes through a level of the dielectric stack 143C or a level of the layers 141C and 142C, extends through the layers 130 and 113, and extends partially through the layer 112 along the Z direction or a direction approximately perpendicular to the substrate 110. The level of the stack 143C or the stack layers 141C and 142C is in an X-Y plane and positioned with regard to the Z direction or a direction approximately perpendicular to the substrate 110. The structure of the alignment mark 121C has a sidewall that is proximately perpendicular to the substrate 110, and contains a portion of the stack 143C (i.e., one or more pairs of the stack layers 141C and 142C on the sidewall and bottom surface of the opening 124). The BSG cut 122C extends through the dielectric stack 143C with the layers 141C and 142C along the Z direction. The BSG cut 122C may partial extend through the layer 130 in some cases.

Figure 11:
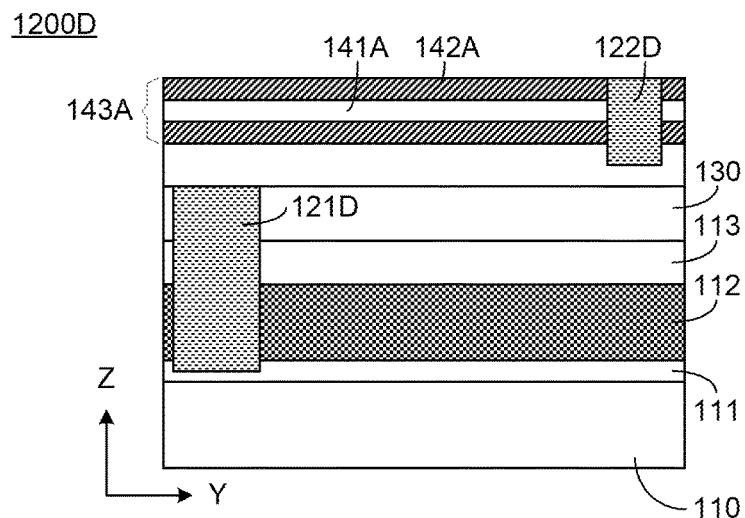

FIG. 11 shows a cross-sectional view 1200D of the portion 1200 depicted in FIG. 1B. A dielectric stack 143A with stack layers 141A and 142A corresponds to the dielectric stack 143 shown in FIG. 1B. As illustrated in FIG. 11, the dielectric stack 143A is deposited over the sacrificial layer 130. Similar to the stack 143, the dielectric stack 143A may have one or more pairs of the stack layers 141A and 142A. After the sacrificial layer 130 is deposited, on opening is etched for making an alignment mark 121D. The opening extends through the layers 130, 113, and 112, and partially through the layer 111 along the Z direction. The opening is then filled with a dielectric material to become the alignment mark 121D. Similar to the opening, the alignment mark 121D extends through the layers 130, 113, and 112, and partially through the layer 111 along the Z direction.

Further, the dielectric stack 143A is formed over the sacrificial layer 130 and alignment mark 121D. Another opening is etched, and subsequently filled with a dielectric material to form a BSG cut 122D. The BSG cut 122D extends through the dielectric stack 143A with the layers 142A and 141A along the Z direction. Since the openings for the alignment mark 121D and BSG cut 122D are filled separately, the fabrication cost may be higher than that when the two openings are filled at the same time. As such, compared to the alignment mark 121D and BSG cut 122D shown in FIG. 11, the alignment mark 121B and BSG cut 122B shown in FIG. 7 and the alignment mark 121C and BSG cut 122C shown in FIG. 10 may have a reduced fabrication cost. The alignment mark 121A and BSG cut 122A shown in FIG. 4 may have similar cost benefit when they are formed by filling at the same time. In addition, the structures of the alignment marks 121A, 121B, and 121C may improve reliability issues, which are illustrated in descriptions below.

After the alignment mark and BSG cut are made as described above, the top surface of the 3D array device 100 is planarized in a planarization process. Further, a deposition process is performed to grow the stack layers 141 and 142 alternately to form the dielectric stack 144 on the planarized top surface.

Figure 12A:
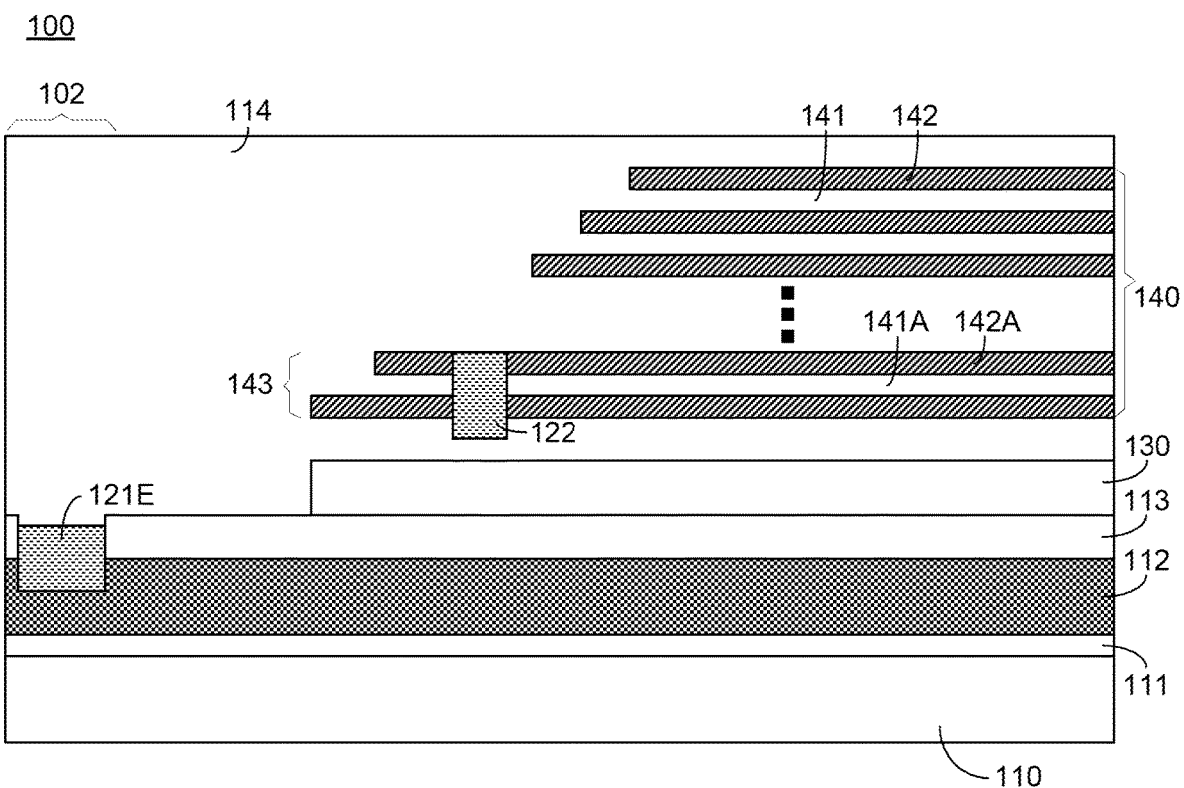
FIGS. 12A and 12B illustrate cross-sectional views with different alignment mark structures of the 3D array device after a staircase structure is formed according to various aspects of the present disclosure
Figure 12B:
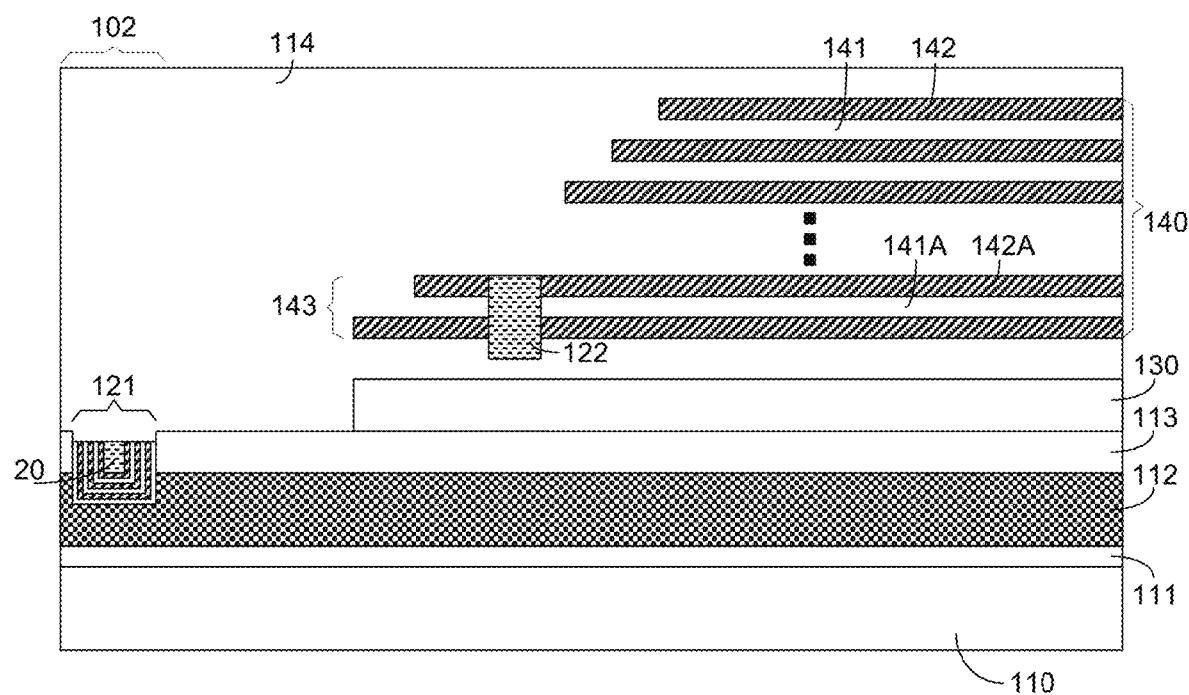

FIGS. 12A and 12B show schematic cross-sectional views of the 3D array device 100 after a staircase formation process according to aspects of the present disclosure. FIG. 12A depicts an alignment mark 121E that corresponds to the structure of the alignment mark 121A shown in FIG. 4. FIG. 12B depicts an alignment mark 121 that corresponds to the structure of the alignment mark 121B shown in FIG. 7 or the structure of the alignment mark 121C shown in FIG. 10. The BSG cuts are not affected by the staircase formation process. Since the BSG cuts 122A, 122B, and 122C illustrated above may have the same structure or similar structures, they are represented by a BSG cut 122 in FIGS. 12A and 12B. As shown in the figures, during the staircase formation process, a portion of the dielectric stack 140 is trimmed into a staircase structure. Any suitable etching processes, including dry etch and/or wet etch process, may be used in the staircase formation process. For example, the height of the staircase structure may increase in a stepwise manner along the Y direction. A dielectric layer 114 is deposited to cover the staircase structure and the layer 113. As illustrated in FIGS. 12A and 12B, part of the dielectric stack 140 and the sacrificial layer 130 is removed in a region on a side of the staircase structure, e.g., on the left side of the staircase structure. The region may include a contact region and the non-functional region 102. The contact region may be arranged for through silicon contacts connected to contact pads. The word "connected" as used herein, indicates electrically connected. The contact region contains a portion of the dielectric layer 114 and thus is a dielectric region.

With reference to FIG. 1B, when a portion of the dielectric stack 140 is trimmed into the staircase structure, the alignment mark 1210 (or the alignment mark 121A, 121B, or 121C) is trimmed as well. The dimension of the alignment mark is reduced in the Z direction. In some embodiments, the trimmed alignment mark (e.g., the alignment mark 121 and 121E) becomes positioned below the level of the layer 130, as illustrated in FIGS. 12A and 12B. The level of a layer or stack as used herein is in an X-Y plane and arranged along the Z direction or a direction approximately perpendicular to the substrate 110. In some cases, the alignment mark 121 (or 121E) may extend through the layer 113 and partially through the semiconductor layer 112 along the Z direction or a direction approximately perpendicular to the substrate 110. Optionally, the top level of the alignment mark 121 (or 121E) may be lower than the top level of the layer 113 after the alignment mark is trimmed in the staircase formation process. Further, the alignment mark 121 still contains one or more pairs of the dielectric stack layers (i.e., 141B1 and 142B1, or 141C and 142C) that are alternately stacked before the staircase formation process. For example, the alignment mark 121 may contain one or more pairs of the dielectric stack layers in the sidewall and bottom part, as shown in FIG. 12B. Further, after being trimmed, the alignment mark 121 (or 121E) is subsequently covered by the dielectric layer 114 and becomes separated from the dielectric stack 143. As such, the dielectric stack layers of the alignment mark 121 are separated from the dielectric stack layers of the stack 143, and thus not affected by processes that transform the stack 143 thereafter. Further, the alignment marks 121 and 121E may be used as a common alignment mark in subsequent fabrication processes, and referred to as the zero mark in some cases. In descriptions below, the alignment mark 121 is used exemplarily and may be replaced by the alignment mark 121E in some cases.

Figure 13:
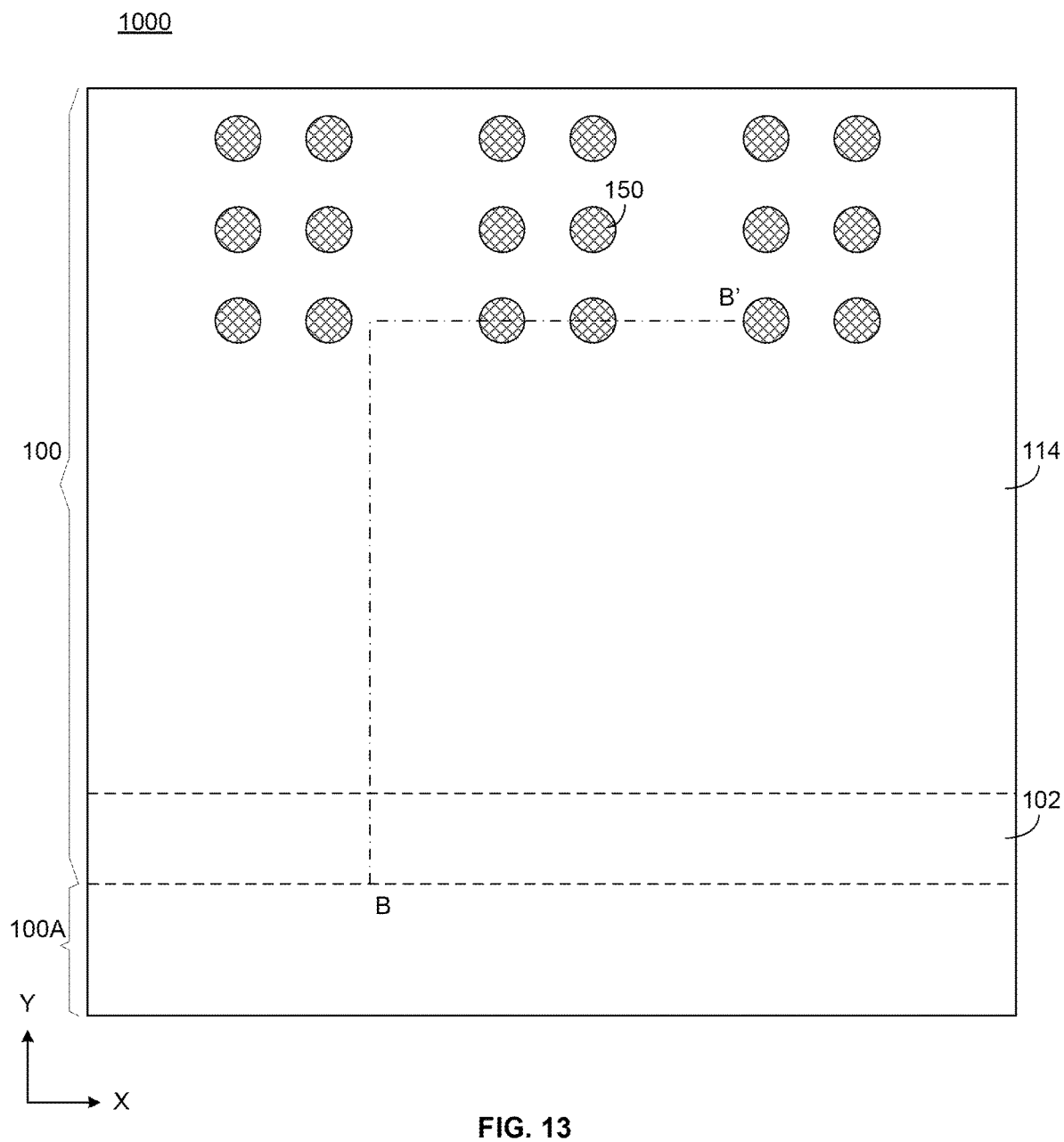
FIGS. 13 and 14 illustrate a top view of the exemplary structure and a cross-sectional view of the 3D array device shown in FIG. 12B after channel hole structures and functional layers are formed according to various aspects of the present disclosure.
Figure 14:
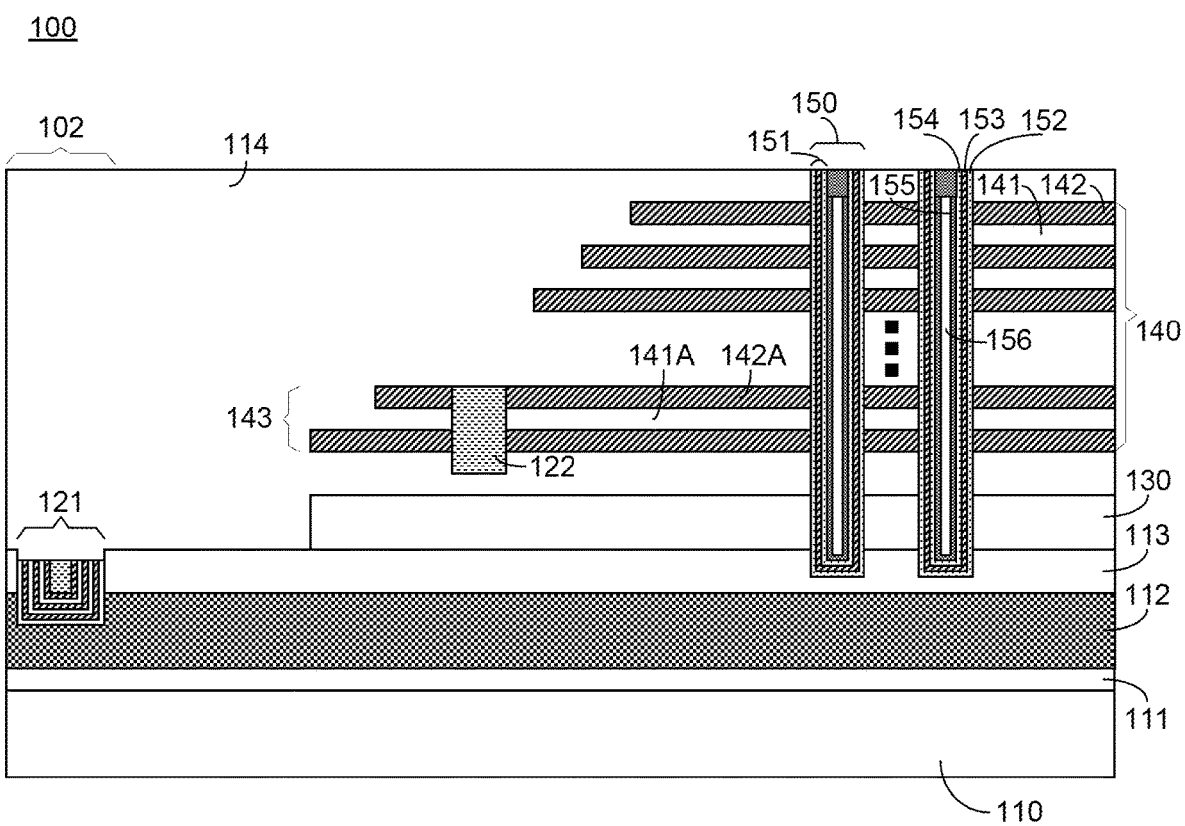

FIGS. 13 and 14 show a schematic top view of the structure 1000 and a schematic cross-sectional view of the 3D array device 100 after channel hole structures 150 are formed according to aspects of the present disclosure. The cross-sectional view shown in FIG. 14 is taken along a line BB' of FIG. 13. Assuming that the cross-sectional view contains the alignment mark 121 and BSG cut 122. The quantity, dimension, and arrangement of the channel hole structure 150 shown in FIGS. 13 and 14 and in other figures in the present disclosure are exemplary and for description purposes, although any suitable quantity, dimension, and arrangement may be used for the disclosed 3D array device 100 according to various aspects of the present disclosure.

As shown in FIGS. 13 and 14, the channel hole structures 150 are arranged to extend in the Z direction or in a direction approximately perpendicular to the substrate 110 and form an array of a predetermined pattern (not shown) in the X-Y plane. The channel holes may be formed by, for example, a dry etch process or a combination of dry and wet etch processes. Other processes may also be performed, such as a patterning process involving lithography, cleaning, and/or chemical mechanical polishing (CMP). The channel holes may have a cylinder shape or pillar shape that extends through the dielectric stack 140 and the sacrificial layer 130, and partially penetrates the dielectric layer 113. After the channel holes are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunneling layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. Like the channel holes, the semiconductor channel 155 also extends through the dielectric stack 140 and into the layer 113. The blocking layer 152, the charge trap layer 153, the tunneling layer 154, and the semiconductor channel 155 may be deposited by, e.g., CVD and/or ALD. The structure formed in a channel hole including the functional layer 151 and semiconductor channel 155, is referred to as the channel hole structure 150.

After the semiconductor channel 155 is formed, the opening of the channel hole is filled by an oxide material 156 and a conductive plug, as shown in FIG. 14. The conductive plug includes a conductive material such as doped polysilicon.

In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer. Optionally, the functional layer 151 may have a structure different from the ONO configuration. In the following descriptions, the ONO structure is used exemplarily.

Referring to FIG. 14, the channel holes are etched after the staircase structure is formed. Optionally, the channel hole structures 150 may also be formed before the staircase formation process. For example, after the alignment mark 1210, the BSG cut 122, and the dielectric stack 140 are fabricated as shown in FIG. 1B, the channel holes may be formed and then the functional layer 151 and semiconductor channel 155 may be deposited. After the channel holes are filled with the oxide material 156, the staircase formation process may be performed to form the staircase structure.

Figure 15:
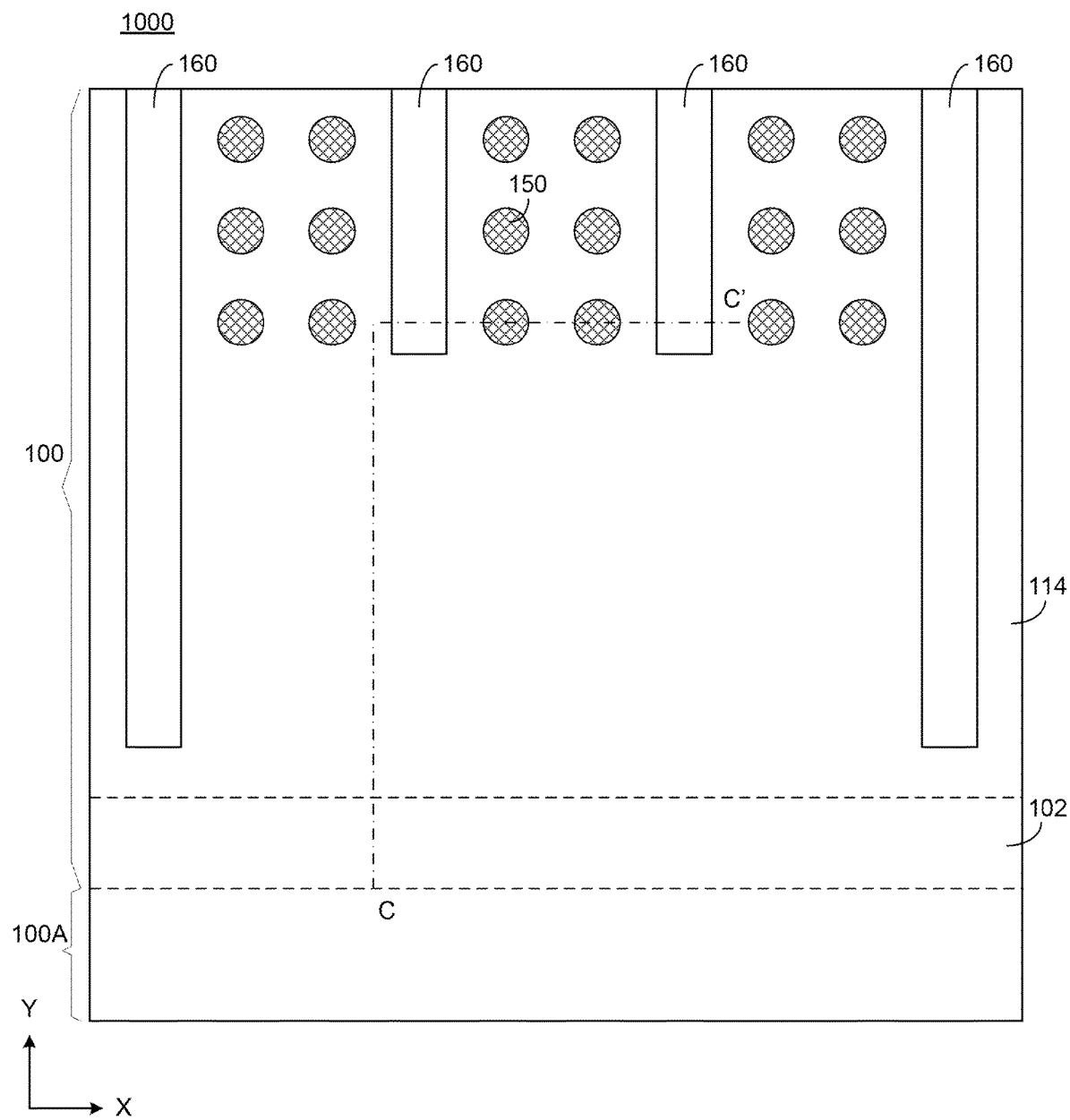
FIGS. 15 and 16 illustrate a top view of the exemplary structure and a cross-sectional view of the 3D array device shown in FIG. 14 after gate line slits are formed according to various aspects of the present disclosure.
Figure 16:
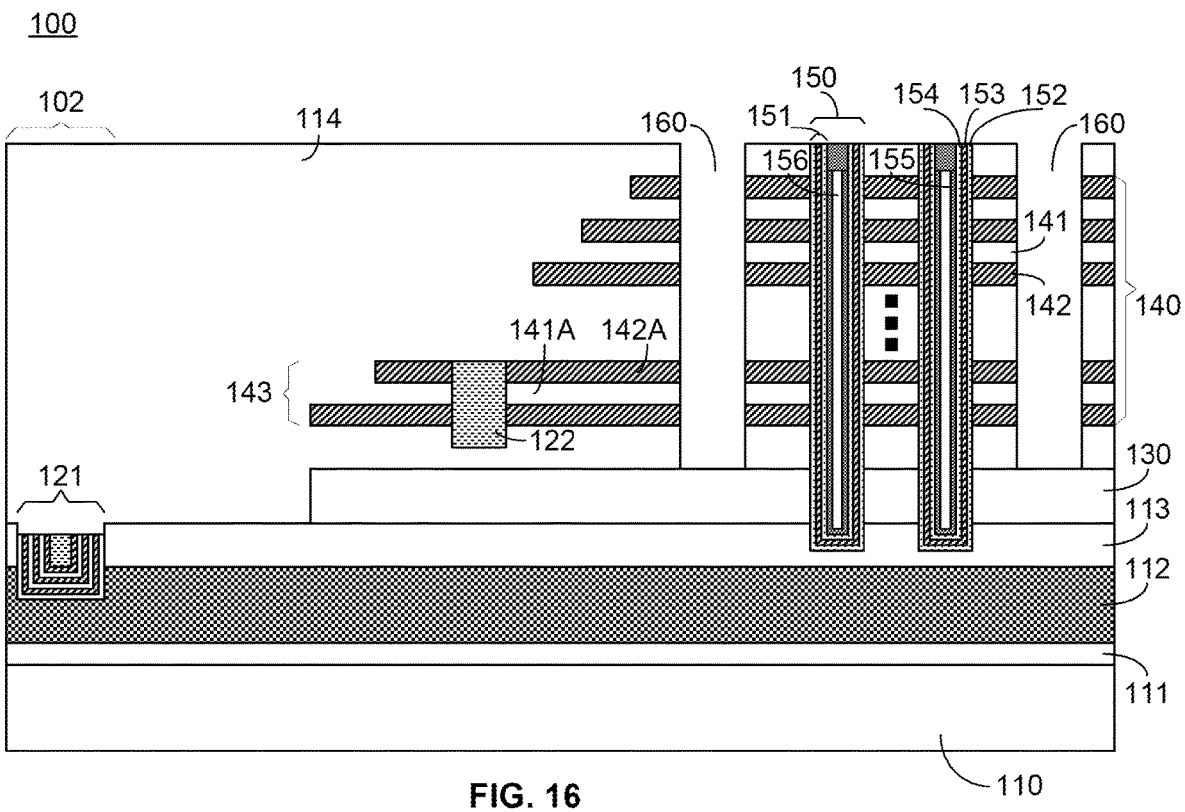

FIGS. 15 and 16 show a schematic top view of the structure 1000 and a schematic cross-sectional view of the 3D array device 100 after gate line slits 160 are formed according to aspects of the present disclosure. The cross-sectional view shown in FIG. 16 is taken along a line CC' of FIG. 15. A gate line slit may also be referred to as a gate line slit structure. The 3D array device 100 has a great number of channel hole structures 150 arranged in memory planes (not shown). Each memory plane is divided into memory blocks (not shown) and memory fingers by the gate line slits. For example, the configuration of the channel hole structures 150 as shown in FIG. 15 reflects memory fingers between the gate line slits 160.

The gate line slits 160 may be formed by, for example, a dry etch process or a combination of dry and wet etch processes. As shown in FIGS. 15 and 16, the gate line slits 160 extend, e.g., in the X and Y directions horizontally, and extend through the dielectric stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD and/or ALD. The spacer layers are configured to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the bottom portions of the blocking layers 152 formed in the channel holes 150. Further, multiple selective etch processes, e.g., multiple selective wet etch processes, are performed to remove the exposed portions of the blocking layer 152, the charge trap layer 153, and the tunneling layer 154 consecutively, which exposes bottom side portions of the semiconductor channel 155.

After the etch processes, the layer 113 and side portions of the semiconductor channel 155 close to the bottom of the channel hole structure 150 are exposed in the cavity left by etching away the sacrificial layer 130. The cavity is filled by a semiconductor material, e.g., polysilicon, to form a semiconductor layer 131, e.g., by a CVD and/or ALD deposition process. The semiconductor layer 131 is n-doped, formed on the exposed surface of the layer 113 and sidewalls or side portions of the semiconductor channel 155, and connected to the semiconductor channel 155.

Figure 17:
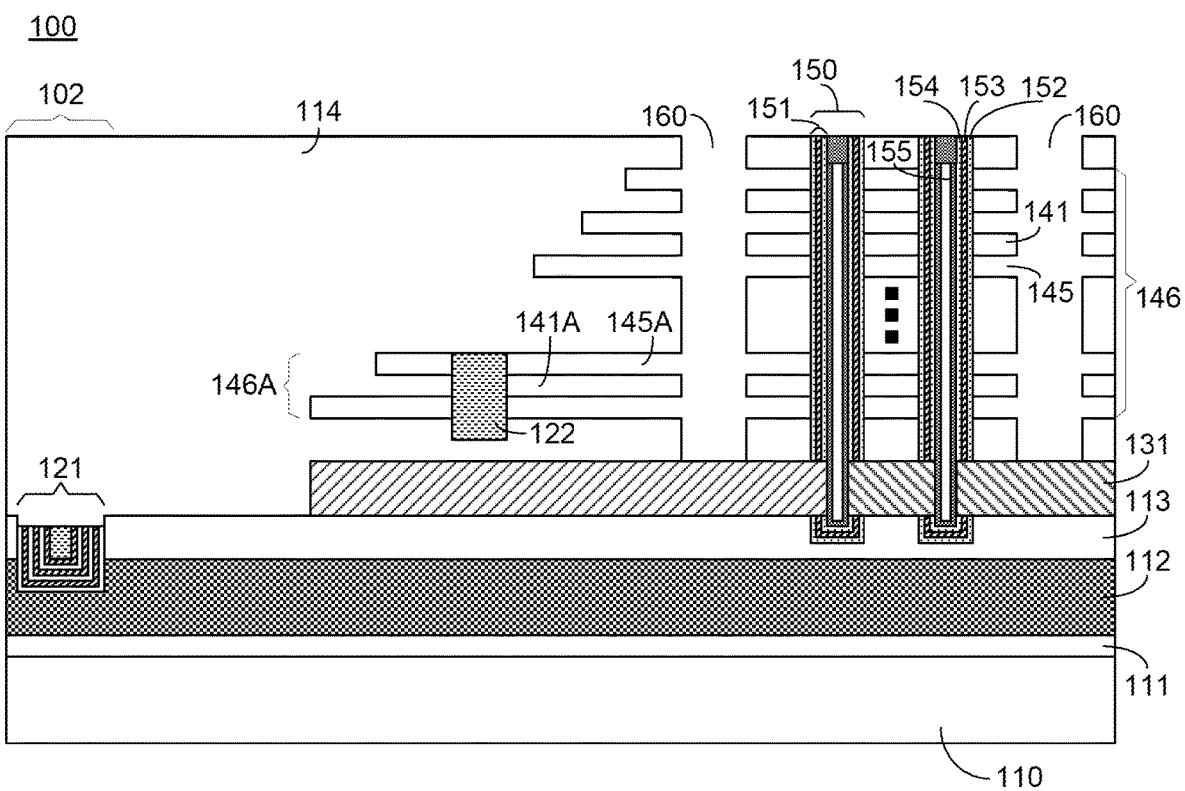
FIGS. 17-19 illustrate cross-sectional views of the 3D array device shown in FIG. 16 at certain stages in the fabrication process according to various aspects of the present disclosure.

When the bottom parts of the functional layer 151 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 are also silicon nitride, the innermost spacer layer and the second dielectric layers 142 may be removed together during the etch process, leaving cavities 145 between the first dielectric layers 141, as shown in FIG. 17. In some cases, the stack layer 142A contains the same material as the layer 142, and thus may be removed as well during the etch process, leaving cavities 145A between the stack layers 141A. As such, the dielectric stack 140 and 143 are changed into dielectric stacks 146 and 146A, respectively.

Figure 18:
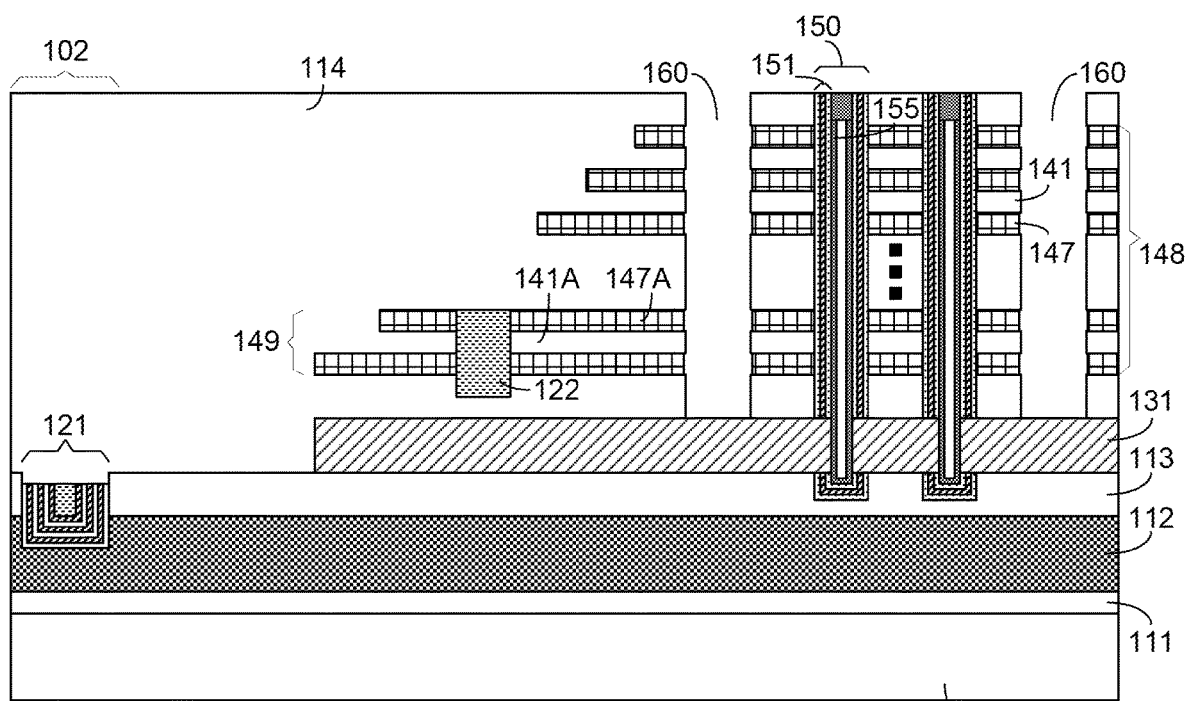

Further, a conductive material such as tungsten (W) is grown to fill the cavities 145 and 145A left by the removal of the second dielectric layers 142 and 142A, forming conductive layers 147 between the first dielectric layers 141, and conductive layers 147A between the stack layers 141A. After the conductive layers 147 and 147A are fabricated, the dielectric stack 146 and 146A are converted into conductor/insulator stacks 148 and 149, as shown in FIG. 18. The conductor/insulator stack 148 includes the stack 149 and both contain a dielectric layer and a conductive layer 147 that are alternatingly stacked over each other. As the dielectric stack 143 may contain one or more pairs of the stack layers, the conductor/insulator stack 149 may contain one or more conductive layers 147A. The alignment mark 121 is below a level of the layers 141A and 147A. The level of the layers 141A and 147A is in an X-Y plane and arranged along the Z direction or a direction approximately perpendicular to the substrate 110. The one or more conductive layers 147A are used as a selector, that is, the BSG of the 3D array device 100. The BSG cut 122 extends through the conductor/insulator stack 149 (or the one or more conductive layers 147A) along the Z direction or a direction approximately perpendicular to the substrate 110, and is used to separate one portion from another portion of the conductive layer 147A.

In some aspects, before metal W is deposited in the cavities 145 and 145A, a dielectric layer (not shown) of a high-k dielectric material such as aluminum oxide may be deposited. Further, a layer of a conductive material such as titanium nitride (TiN) (not shown) may be deposited, and then metal W is deposited to form the conductive layers 147 and 147A. CVD and/or ALD may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductive layers.

Referring to FIG. 18, a portion of each functional layer 151 in a channel hole structure 150 is between a portion of one of the conductive layers 147 and a portion of a semiconductor channel 155 in the channel hole structure 150. Each conductive layer 147 is configured to connect rows of NAND memory cells in an X-Y plane and is configured as a word line for the 3D array device 100. The semiconductor channel 155 formed in the channel hole structure 150 is configured to connect a column or a string of NAND memory cells along the Z direction and configured as a bit line for the 3D array device 100. As such, a portion of the functional layer 151 in the channel hole structure 150 in the X-Y plane, as a part of a NAND memory cell, is arranged between a conductive layer 147 and a semiconductor channel 155, i.e., between a word line and a bit line. The functional layer 151 may also be considered as disposed between the semiconductor channel 155 and the conductor/insulator stack 148. A portion of the conductive layer 147 that is around a portion of the channel hole structure 150 functions as a control gate or gate electrode for a NAND memory cell. The 3D array device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells through the conductor/insulator stack 148 over the substrate 110.

Figure 19:
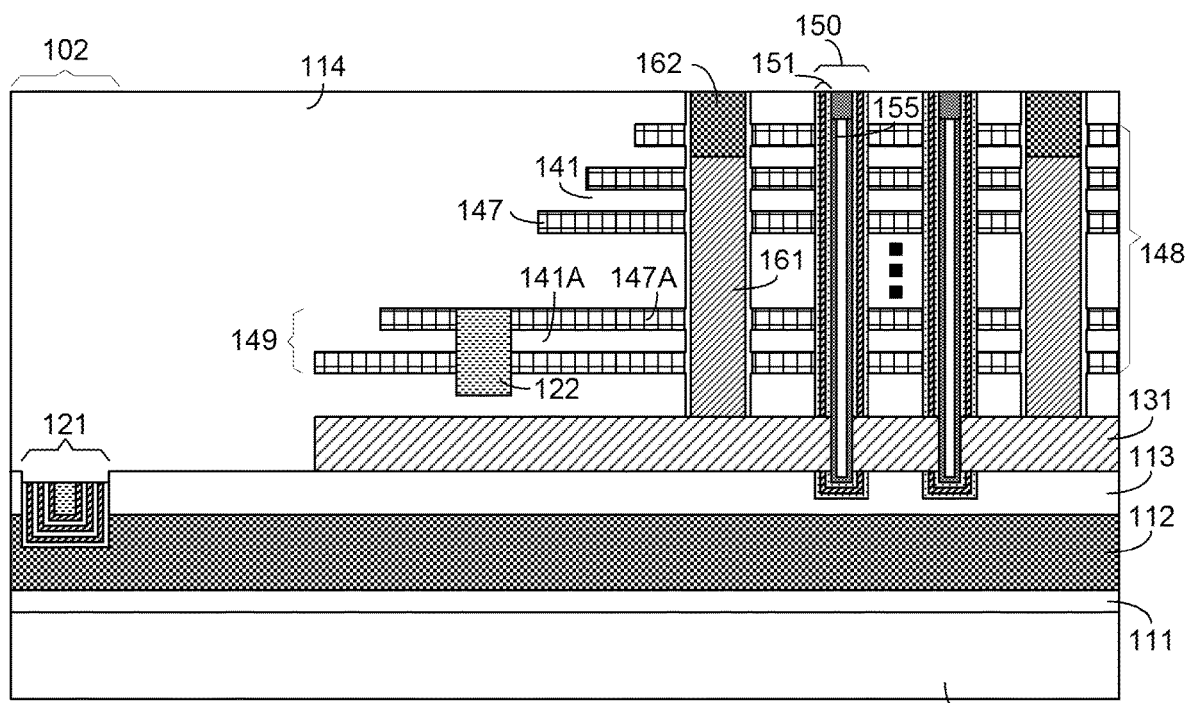

After the conductive layers 147 and 147A are grown in the cavities 145 and 145A, a dielectric layer (e.g., a silicon oxide layer) may be deposited on the sidewalls and bottom surfaces of the gate line slits 160 by CVD and/or ALD. A dry etch process or a combination of dry etch and wet etch processes may be performed to remove the dielectric layer at the bottom of the gate line slits to expose parts of the semiconductor layer 131. The gate line slits are filled with a conductive material 161 (e.g., doped polysilicon) and a conductive plug 162 (e.g., metal W). The conductive material 161 in the gate line slit extends through the conductor/insulator stack 148 and contacts the semiconductor layer 131 that is connected with the semiconductor channel 155, as shown in FIG. 19. The word "contact" as a verb indicates electrically contacting an object as used herein. The filled gate line slits become an array common source for the 3D array device 100 in some aspects. Optionally, forming the array common source in the gate line slits includes depositing an insulation layer, a conductive layer (such as TiN, W, Co, Cu, or Al), and then a conductive material such as doped polysilicon.

Alternatively, the gate line slit 160 may be filled with dielectric materials. In such cases, the gate line slit structure is not a conductive path and not connected with the semiconductor channel 155 electrically. In some implementations, when the channel holes are etched, the channel holes may penetrate through the dielectric stack 140 and layers 130, 113, 112, and 111 to expose the single crystalline silicon substrate 110. Based on the exposed parts of the substrate 110, selective epitaxial growth may be performed to grow doped single crystalline silicon that fills the bottom part of the channel hole. In some cases, the doped single crystalline silicon may grow through the layers 111-112 and enter the layer 113. After the functional layer is deposited on the sidewall and bottom of the channel hole, a selective etch is performed to etch away the functional layer at the bottom of the channel hole to expose the doped single crystalline silicon. When the semiconductor channel is formed on the functional layer, the semiconductor channel is also deposited on the doped single crystalline silicon that is exposed by the selective etch. As such, the semiconductor channel becomes connected to the doped single crystalline silicon at the bottom of the channel hole structure. In some cases, when the substrate 110 is removed in subsequent thinning processes, part of the doped single crystalline silicon may remain for contacting the semiconductor channels.

Figure 20:
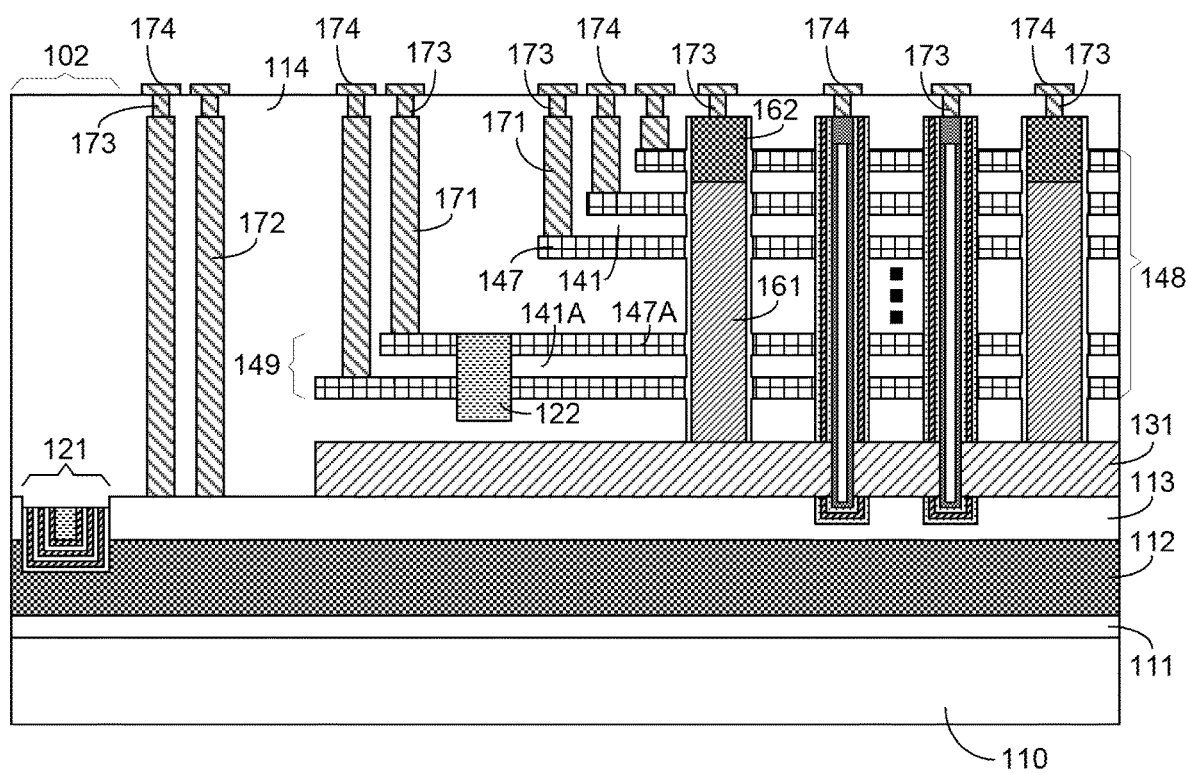
FIGS. 20 and 21 illustrate cross-sectional views of the 3D array device shown in FIG. 19 at certain stages in the fabrication process according to various aspects of the present disclosure.
Figure 21:
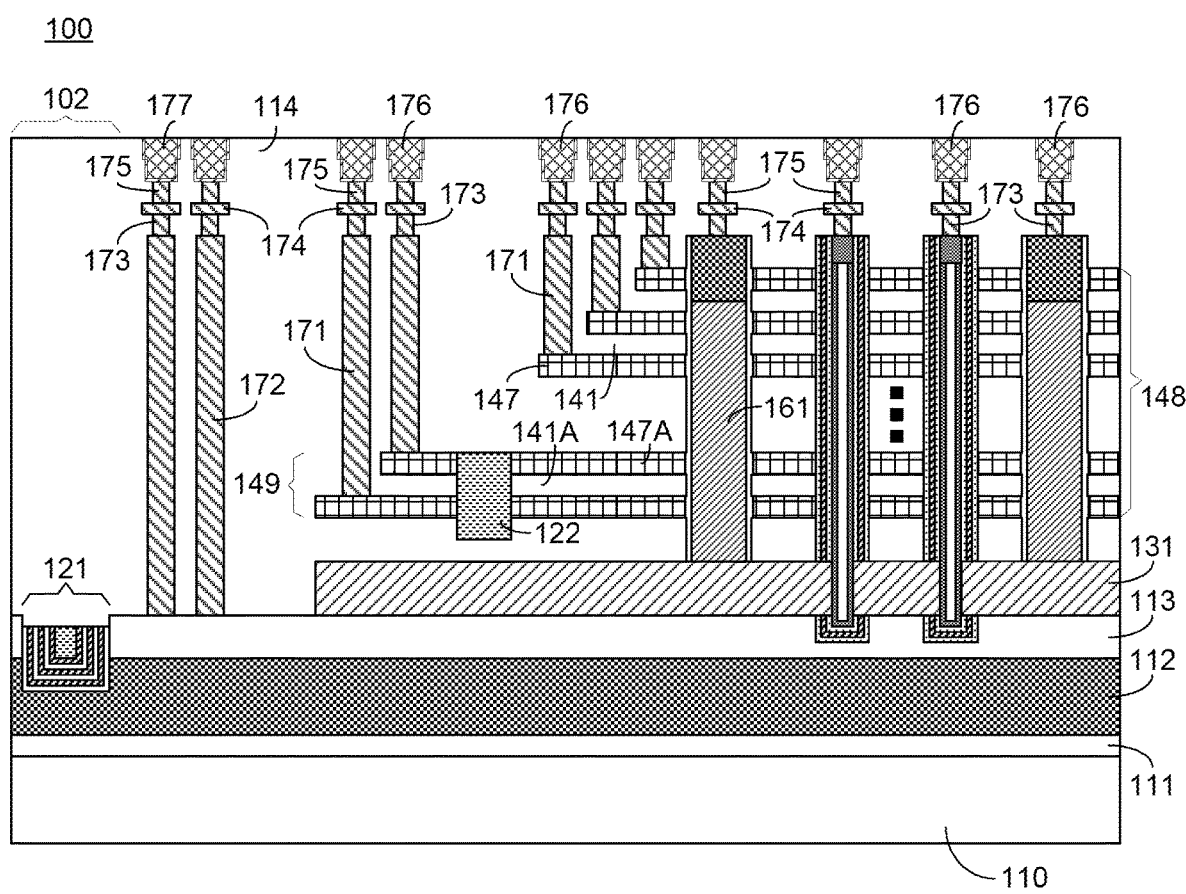

FIGS. 20 and 21 show schematic cross-sectional views of the 3D array device 100 at certain stages after contacts, vias, conductor layers, and connecting pads are formed according to aspects of the present disclosure. After the gate line slits 160 are filled and the array common source is formed as shown in FIG. 19, openings for word line contacts 171 and through silicon contacts 172 are formed respectively by, e.g., a dry etch process or a combination of dry and wet etch processes. The contacts 171-172 are arranged as interconnects for the 3D array device 100. The openings for the contacts 171-172 are respectively filled with a conductive material by CVD, PVD, ALD, electroplating, electroless plating, or any combination thereof. As shown in FIG. 20, the through silicon contacts 172 are formed in the contact region (i.e., a dielectric region) and beside the stack 148 and the NAND memory cells. The staircase structure is disposed between the contacts 172 and the stack 148, i.e., between the contacts 172 and the NAND memory cells in some cases. The contacts 172 may extend to reach the layer 113. Optionally, the contacts 172 may extend to a level above the layer 113 in the dielectric layer 114. The conductive material for the contacts 171-172 may include W, Co, Cu, Al, or a combination thereof. Optionally, a layer of a conductive material (e.g., TiN) may be deposited as a contact layer before another conductive material is deposited when the contacts 171-172 are fabricated respectively.

Further, a CVD or PVD process is performed to deposit a dielectric material (e.g., silicon oxide or silicon nitride) on the 3D array device 100, and the dielectric layer 114 becomes thicker. Openings for vias 173 are formed by a dry etch process or a combination of dry and wet etch processes. The openings may be subsequently filled with a conductive material such as W, Co, Cu, Al, or a combination thereof to form the vias 173, as shown in FIG. 20. CVD, PVD, ALD, electroplating, electroless plating, or a combination thereof may be performed. The vias 173 are connected to the contacts 171-172, the upper ends of NAND strings, and the plugs 162 of the array common source. The upper ends of NAND strings are connected to the bit lines, respectively. Optionally, a layer of a conductive material (e.g., TiN) may be deposited first before filling the openings to form the vias 173.

Further, conductor layers 174 for interconnect may be grown by CVD, PVD, ALD, electroplating, electroless plating, or a combination thereof. The conductor layers 174 are deposited over and contact the vias 173, respectively, and include a conductive material such as W, Co, Cu, Al, or a combination thereof. A part of the conductor layers 174 are connected to the bit lines through the vias 173.

Similar to the formation of the vias 173, vias 175 are made over the conductor layers 174. For example, a dielectric material may be deposited to cover the conductor layers 174 and make the dielectric layer 114 thicker, openings for vias 175 may be formed, and the openings may be subsequently filled with a conductive material to form the vias 175.

Further, a CVD or PVD process is performed to deposit a dielectric material (e.g., silicon oxide or silicon nitride) to cover the vias 175 and thicken the dielectric layer 114 further. Openings are made and then filled to form connecting pads 176 and 177 that serve as interconnects with a periphery device. As shown in FIG. 21, the connecting pads 176-177 are deposited over and contact the vias 175, respectively. As such, the connecting pads 176 are connected to the word line contacts 171, the upper ends of corresponding NAND strings, and the plugs 162, respectively. The connecting pads 177 are connected to the through silicon contacts 172, respectively. The connecting pads 176-177 may include a conductive material such as W, Co, Cu, Al, or a combination thereof. Optionally, a contact layer of a conductive material (e.g., TiN) may be deposited first before filling the openings to form the connecting pads 176-177.

Figure 22:
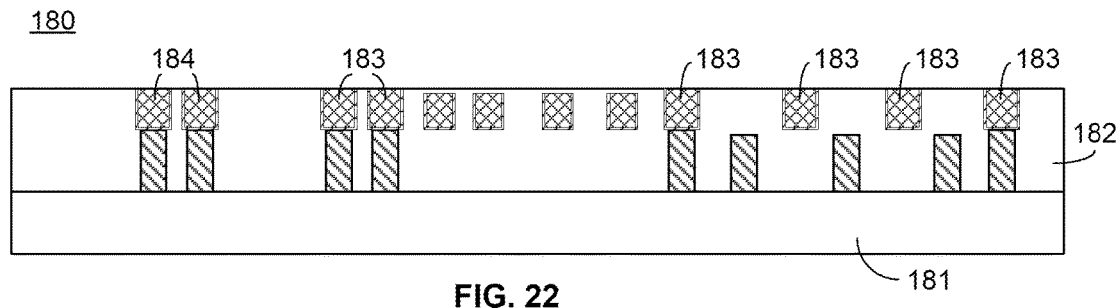
FIG. 22 illustrates a cross-sectional view of an exemplary periphery device according to various aspects of the present disclosure.

FIG. 22 shows a schematic cross-sectional view of a periphery device 180 according to aspects of the present disclosure. The periphery device 180 is a part of a memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits (e.g., control circuits) (not shown) are fabricated on the substrate 181 and used for facilitating the operation of the array device 100. For example, the periphery CMOS circuits may include metal-oxide-semiconductor field-effect transistors (MOSFETs) and provide functional devices such as page buffers, sense amplifiers, column decoders, and row decoders. A dielectric layer 182 is deposited over the substrate 181 and the CMOS circuits. Connecting pads (such as connecting pads 183 and 184) and vias are formed in the dielectric layer 182. The dielectric layer 182 includes one or more dielectric materials such as silicon oxide and silicon nitride. The connecting pads 183-184 are configured as interconnects with the 3D array device 100 and may include a conductive material such as W, Co, Cu, Al, or a combination thereof.

For the 3D array device 100 and periphery device 180, the bottom side of the substrate 110 or 181 may be referred to as the back side, and the side with the connecting pads 176-177 or 183-184 may be referred to as the front side or face side.

Figure 23:
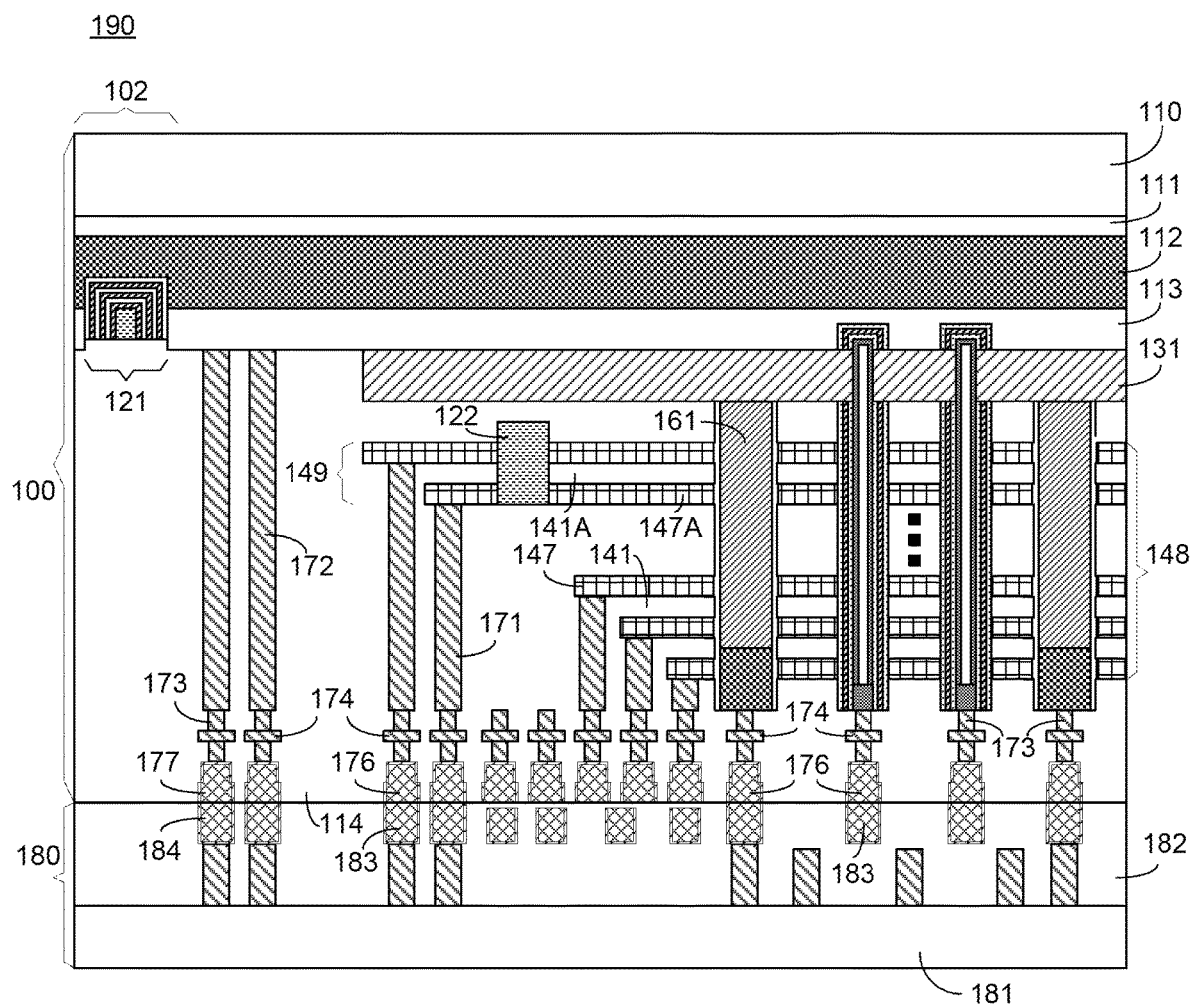
FIG. 23 illustrates a cross-sectional view of a 3D memory device after the 3D array device shown in FIG. 21 is bonded with the periphery device shown in FIG. 22 according to various aspects of the present disclosure.
Figure 24:
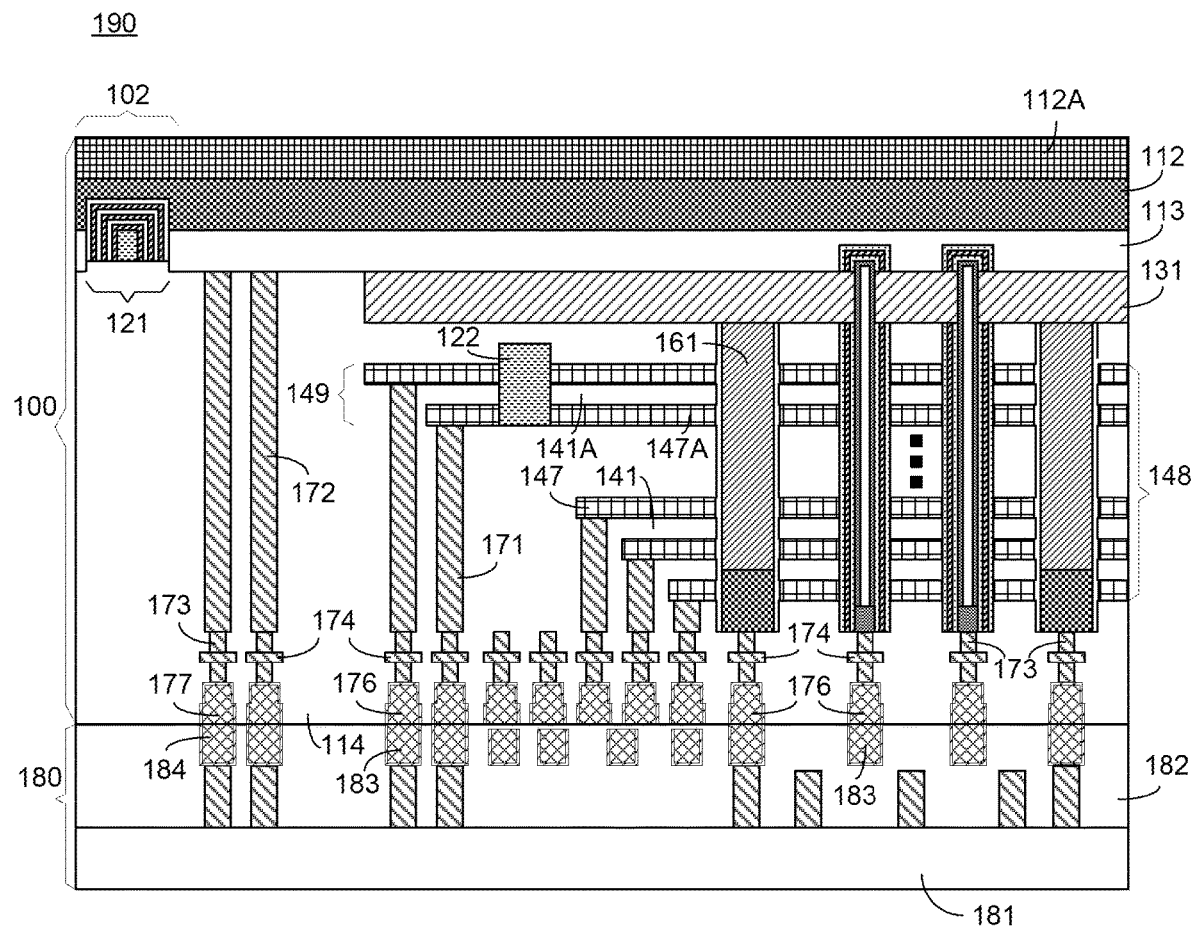
FIG. 24 illustrates a cross-sectional view of the 3D memory shown in FIG. 23 at a certain stage according to various aspects of the present disclosure.

FIGS. 23 and 24 schematically show a fabrication process of an exemplary 3D memory device 190 in a cross-sectional view according to aspects of the present disclosure. The 3D memory device 190 includes the 3D array device 100 shown in FIG. 21 and the periphery device 180 shown in FIG. 22.

The 3D array device 100 and periphery device 180 are bonded by a flip-chip bonding method to form the 3D memory device 190, as shown in FIG. 23. In some aspects, the 3D array device 100 is flipped vertically and becomes upside down with the top surfaces of the connecting pads 176-177 facing downward. The two devices are placed together such that the 3D array device 100 is above the periphery device 180. After an alignment is made, e.g., the connecting pads 176-177 are aligned with the connecting pads 183-184, respectively, the 3D array device 100 and periphery device 180 are joined face to face and bonded together. The conductor/insulator stack 148 and the periphery CMOS circuits become sandwiched between the substrates 110 and 181 or between the semiconductor layer 112 and the substrate 181. In some aspects, a solder or a conductive adhesive is used to bond the connecting pads 176-177 with the connecting pads 183-184, respectively. As such, the connecting pads 176-177 are connected to the connecting pads 183-184, respectively. The 3D array device 100 and periphery device 180 are in electrical communication after the flip-chip bonding process is completed.

Further, from the bottom surface (after the flip-chip bonding), the substrate 110 of the 3D array device 100 is thinned by a thinning process, such as wafer grinding, dry etch, wet etch, CMP, or a combination thereof. Optionally, the substrate 110, the dielectric layer 111 and a portion of the semiconductor layer 112 may be removed in the thinning process, exposing the semiconductor layer 112. As the removed portion of the semiconductor layer 112 is relatively small, and the alignment mark 121 only penetrates the semiconductor layer 112 with a limited depth, the alignment mark 121 is not exposed during the thinning process. As such, in some embodiments, the entire alignment mark 121 or the entire structure of the alignment mark 121 is formed between the semiconductor layer 112 and the dielectric layer 114. Further, in some embodiments, the alignment mark 121 or the structure of the alignment mark 121 is formed only between a level of the semiconductor layer 112 and a level of one of the stack layers of the stack 148. In other words, the entire structure of the alignment mark 121 is formed between a level of the semiconductor layer 112 and a level of one of the stack layers of the stack 148. When the semiconductor layer 112 is a polysilicon layer in some cases, the entire structure of the alignment mark 121 is formed between a level of the polysilicon layer 112 and a level of one of the stack layers of the stack 148. Optionally, a layer such as a polysilicon layer 112A is grown over the semiconductor layer 112 by a deposition process (e.g., a CVD or PVD process), as shown in FIG. 24.

Further, other fabrication steps or processes are performed to complete fabrication of the 3D memory device 190. The other fabrication steps and processes are not reflected in FIG. 24 for simplicity. For example, a dielectric layer may be grown over the polysilicon layer 112A by CVD or PVD. With similar methods as described above, vias and conductor layers are formed that connect the through silicon contacts 172, respectively. Further, a passivation layer is deposited and contact pads are formed that connect contacts 172. Further, additional fabrication steps or processes are performed. Details of the additional fabrication steps or processes are omitted for simplicity.

As the alignment mark 121 is not exposed after a small portion of the semiconductor layer 112 is removed in the thinning process, the polysilicon layer 112A does not contact the alignment mark 121. In some cases, the semiconductor layer 112 is made of polysilicon, and the alignment mark is formed of an oxide material (e.g., silicon oxide). As such, the interface between layers 112 and 112A is an interface between two polysilicon layers. However, if the alignment mark 121 penetrates through the semiconductor layer 112, e.g., the alignment mark 121D shown in FIG. 11, the alignment mark 121 may be exposed when the layer 111 is removed in the thinning process. Consequently, the polysilicon layer 112A may be deposited partially on the alignment mark 121, creating an interface between polysilicon and oxide. As dangling bonds, shallow traps, and other defects may be generated in the interface between polysilicon and oxide, the reliability of the 3D memory device 190 may be affected. Hence, when the alignment mark 121 does not extend through the semiconductor layer 112, an interface between polysilicon and oxide may be avoided, defects may be reduced, and the reliability may be improved.

Figure 25:
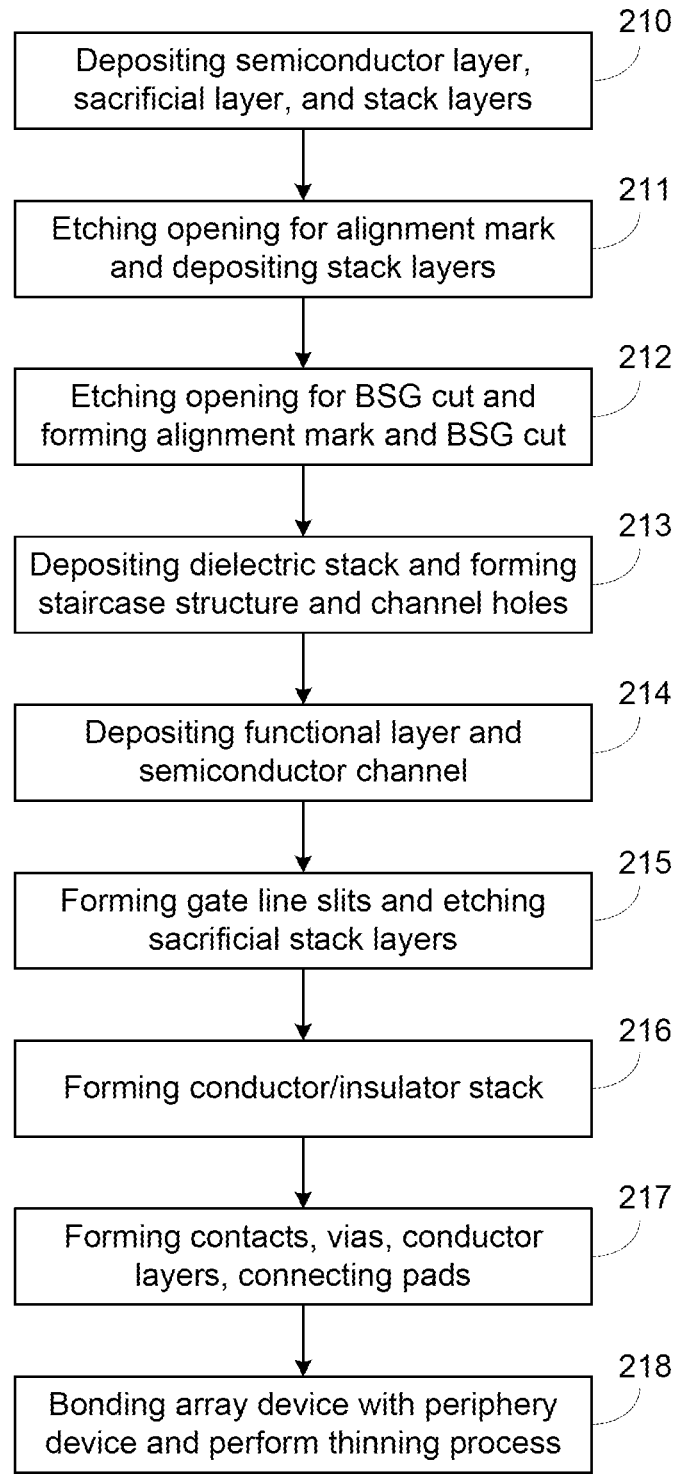
FIG. 25 illustrates a schematic flow chart of fabrication of a 3D memory device according to various aspects of the present disclosure.

FIG. 25 shows a schematic flow chart 200 for fabricating a 3D memory device according to aspects of the present disclosure (e.g., referring above FIGS. for structures of the 3D memory device during the fabrication process). At 210, a substrate is provided for fabricating a 3D array device. The substrate includes a semiconductor substrate, such as a single crystalline silicon substrate. In some aspects, a semiconductor layer is deposited over a top surface of the substrate, and a sacrificial layer is deposited over the semiconductor layer. Between the substrate and the semiconductor layer, a dielectric layer is formed. Between the semiconductor layer and the sacrificial layer, another dielectric layer is formed. Over the sacrificial layer, a dielectric stack is deposited that includes alternating dielectric stack layers. The semiconductor layer and sacrificial layer may include polysilicon.

At 211, a first opening is formed by etching for making an alignment mark. Optionally, the first opening or at least a part of the first opening is configured in a non-functional region. The first opening extends through the dielectric stack layers, the sacrificial layer, and partially penetrates the semiconductor layer. Further, additional dielectric stack layers are deposited to make the dielectric stack thicker. The additional dielectric layers, alternately stacked, are also deposited on the sidewall and bottom surface of the first opening.

At 212, a second opening for a BSG cut is formed by etching that extends through the stack layers of the dielectric stack. The first and second openings are filled by a dielectric material at the same time to form the alignment mark and BSG cut. The BSG cut contains the dielectric material, while the alignment mark contains the dielectric material plus a sidewall made of a certain number of the dielectric stack layers. Optionally, the alignment mark or at least a portion of the alignment mark is arranged in the non-functional region. Further, a planarization process is performed to create a planar top surface.

At 213, more alternating dielectric stack layers are deposited over the dielectric stack, the alignment mark, and the BSG cut, making the dielectric stack much thicker. In some cases, the dielectric stack contains a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

Further, a staircase formation process is performed to convert a portion of the dielectric stack into a staircase structure. The staircase formation process includes multiple etches that are used to trim the portion of the dielectric stack into the staircase structure. The alignment mark may also be trimmed along a direction approximately perpendicular to the substrate in the staircase formation process. After a portion of the alignment mark is removed, the alignment mark may still contain a sidewall made of the dielectric stack layers alternately stacked. The trimmed alignment mark extends partially through the semiconductor layer. A deposition process is performed to deposit a dielectric layer to cover the staircase structure and the exposed alignment mark. A part of the dielectric layer on a side of the staircase structure is used as a contact region where through silicon contacts for contact pads are configured. Further, channel holes are formed that extend through the dielectric stack and the sacrificial layer.

At 214, a functional layer is deposited on the sidewall and bottom surface of the channel hole. The functional layer includes a blocking layer, a charge trap layer, and a tunneling layer that are formed sequentially. Further, a semiconductor channel is deposited on a surface of the tunneling layer.

At 215, gate line slits of the 3D array device are formed. Along a direction vertical to the substrate, the gate line slit extends through the dielectric stack, and exposes a portion of the sacrificial layer. Further, the sacrificial layer is etched away and a cavity is created. The cavity exposes a bottom portion of the functional layer. The layers of the functional layer exposed sequentially in the cavity, including the blocking layer, the charge trap layer, and the tunneling layer, are etched away, respectively. That is, the bottom portion of the functional layer that is close to the substrate is removed. Hence, portions of the semiconductor channel are exposed in the cavity.

Further, a deposition process is performed to grow an additional semiconductor layer such as a polysilicon layer in the cavity. The additional semiconductor layer contacts the semiconductor channel.

In some aspects, the dielectric stack includes two dielectric stack layers and one of the dielectric stack layers is sacrificial. The sacrificial stack layers are etched away at 215 to leave cavities in the dielectric stack. At 216, the cavities are filled with a conductive material to form conductive layers. The dielectric stack is transformed into a conductor/insulator stack. Further, a dielectric layer is deposited on the sidewall and bottom surface of the gate line slits. Portions of the dielectric layer on the bottom surface are etched out selectively to expose the additional semiconductor layer. Conductive materials, such as TiN, W, Cu, Al, and/or doped polysilicon are deposited in the gate line slits to form an array common source that contacts the additional semiconductor layer.

At 217, etching and deposition processes are performed to form word line contacts, through silicon contacts, vias, conductor layers, and connecting pads. The conductor layers may include metal lines for interconnect.

At 218, a flip-chip bonding process may be performed to bond the 3D array device and a periphery device or fasten the 3D array device with a periphery device to create a 3D memory device. In some aspects, the 3D array device is flipped upside down and positioned above the periphery device. The connecting pads of the 3D array device and the periphery device are aligned and then bonded. Further, the substrate of the 3D array device is removed and the semiconductor layer deposited over the substrate is thinned in a thinning process. Because the alignment mark extends through the semiconductor layer with a limited depth, the alignment mark is not exposed in the thinning process. In some cases, the semiconductor layer is a polysilicon layer and the alignment mark contains an oxide material. Hence, when another polysilicon layer is deposited on the thinned polysilicon layer, it does not create an oxide-polysilicon interface. As such, fewer defects are generated and reliability issues associated with the defects are improved.

Further, etching and deposition processes are performed to form vias, conductor layers, and contact pads over the through silicon contacts in the contact region of the 3D array device. The contact pads are configured for wire bonding for connection with other devices.

As illustrated above, because the alignment mark penetrates the semiconductor layer only partially, defects may be reduced and the reliability of the 3D memory device may be improved. In addition, since the alignment mark and BSG cut are filled at the same time, it may save the fabrication cost. The above-described methods and processes are about semiconductor manufacturing, and thus apply to fabrication of a wide range of semiconductor devices and semiconductor structures.

Figure 26:
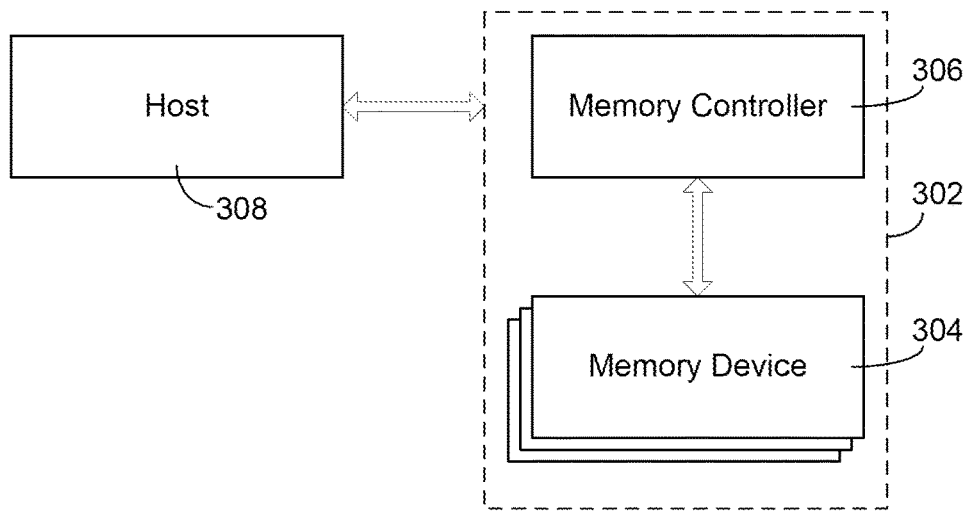
FIG. 26 illustrates a block diagram of an exemplary system having a memory device according to various embodiments of the present disclosure.

FIG. 26 shows a block diagram of an exemplary system 300 having a memory device according to various aspects of the present disclosure. The system 300 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 26, the system 300 may include a host 308 and a memory system 302 having one or more memory devices 304 and a memory controller 306. The host 308 may be a processor of an electronic device, such as a central processing unit (CPU), or a system-on-chip (SoC), such as an application processor (AP). The host 308 may be configured to send or receive data to or from the memory devices 304.

The memory controller 306 is coupled to the memory devices 304 and host 308 and is configured to control the memory devices 304, according to some implementations. The memory controller 306 may manage the data stored in the memory devices 304 and communicate with the host 308. In some embodiments, the memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 306 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 306 may be configured to control operations of the memory device 304, such as read, erase, and program operations.

The memory controller 306 may also be configured to manage various functions with respect to the data stored or to be stored in the memory device 304 including, but not limited to bad-block management, garbage collection, logical-to-physical address conversion, wear leveling, etc. In some implementations, the memory controller 306 is further configured to process error correction codes (ECCs) with respect to the data read from or written to the memory device 304. Any other suitable functions may be performed by the memory controller 306 as well, for example, formatting the memory device 304. The memory controller 306 may communicate with an external device (e.g., the host 308) according to a particular communication protocol. For example, the memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 304 may be any memory device disclosed in the present disclosure, such as the 3D memory device 190 shown in FIG. 24. As described above, because of the design of the alignment mark (e.g., the alignment marks 121 and 121E), certain defects may be avoided. The reliability of the memory device may be improved. Thus, the reliability of a system that employs the memory device may be improved. Further, since the cost of the memory device may be reduced when the alignment mark and BSG cut share certain fabrication processes, the cost of a system that employs the memory device may be reduced as well.

Figure 27:
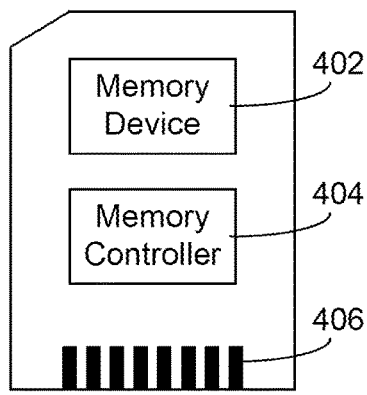
FIG. 27 illustrates a diagram of an exemplary memory card having a memory device, according to various aspects of the present disclosure.
Figure 28:
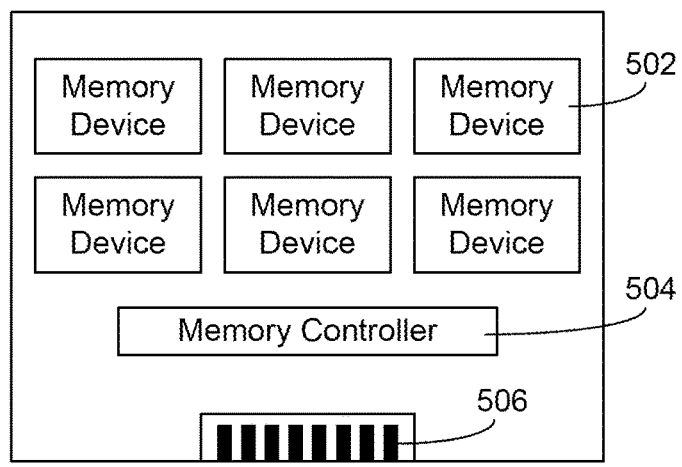
FIG. 28 illustrates a diagram of an exemplary solid-state drive (SSD) having a memory device, according to various aspects of the present disclosure.

The memory controller 306 and one or more memory devices 304 may be integrated into various types of storage devices, for example, be included in the same package, such as a universal Flash storage (UFS) package or an eMMC package. That is, the memory system 302 may be implemented and packaged into different types of end electronic products. FIGS. 27 and 28 exemplarily illustrate block diagrams of a memory card 400 and an SSD 500 according to various aspects of the present disclosure. As shown in FIG. 27, a memory controller 404 and a single memory device 402 may be integrated into the memory card 400. The memory device 402 may be any memory device illustrated above, such as the 3D memory device 190 shown in FIG. 24. The memory card 400 may include a PC card (personal computer memory card international association (PCM-CIA)), a CF card, a smart media (SM) card, a memory stick, a multimedia card (MMC, RS-MMC, or MMCmicro), an SD card (SD, mini SD, microSD, or SDHC), a UFS, etc. The memory card 400 may further include a memory card connector 406 configured to couple the memory card 400 to a host (e.g., the host 308 shown in FIG. 26). As shown in FIG. 28, a memory controller 504 and multiple memory devices 502 may be integrated into the SSD 500. The memory devices 502 may be any aforementioned memory device, such as the 3D memory device 190 shown in FIG. 24. The SSD 500 may further include an SSD connector 506 configured to couple the SSD 500 to a host (e.g., the host 308 shown in FIG. 26). In some embodiments, the storage capacity and/or the operation speed of the SSD 500 is greater than those of the memory card 400.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A method for fabricating a semiconductor device, comprising:
   providing a substrate;
   forming a semiconductor layer including a semiconductor material over the substrate;
   forming a first dielectric material over the semiconductor layer, and
   forming a first opening that extends partially through the semiconductor layer and through the first dielectric material along a direction approximately perpendicular to the substrate;
   forming a stack structure by depositing a plurality of first stack layers and a plurality of second stack layers that are alternately stacked over a sidewall of the first opening and over the semiconductor layer, the stack structure comprising the plurality of first stack layers and the plurality of second stack layer partially filling the first opening; and
   filling the first opening that is partially filled by the stack structure with a predetermined dielectric material to form an alignment mark for fabricating the semiconductor device, wherein
   the predetermined dielectric material is surrounded by the stack structure, and
   a top surface of the alignment mark is below a top surface of the first dielectric material.

2. The method according to claim 1, further comprising:
   after depositing the plurality of first stack layers and the plurality of second stack layers, forming a second opening extending through the plurality of first stack layers and the plurality of second stack layers along the direction approximately perpendicular to the substrate; and
   when filling the first opening, filling the second opening to form a bottom select gate (BSG) cut structure with the predetermined dielectric material.

3. The method according to claim 2, further comprising:
   before forming the first opening, depositing a third stack layer and a fourth stack layer that are alternately stacked over the semiconductor layer, wherein forming the first opening extending partially through the semiconductor layer includes:
   forming the first opening through the third stack layer and fourth stack layer.

4. The method according to claim 3, wherein forming the second opening extending through the plurality of first stack layers and the plurality of second stack layers comprises:
   forming the second opening through the third stack layer and fourth stack layer.

5. The method according to claim 1, wherein the semiconductor material includes polysilicon.

6. The method according to claim 1, wherein the plurality of first stack layers includes a dielectric material and the plurality of second stack layers includes another dielectric material.

7. The method according to claim 1, further comprising:
   forming a dielectric stack including a fifth stack layer and a sixth layer that are alternately stacked over the second stack layer.

8. The method according to claim 7, further comprising:
   removing the sixth stack layer by etch to form a cavity; and
   depositing a conductive layer in the cavity to form a conductor/insulator stack.

9. A semiconductor device, comprising:
   a semiconductor layer including a semiconductor material;
   a first dielectric material over the semiconductor layer, and
   a portion of an alignment mark, including a second dielectric material, and extending partially through the semiconductor layer,
   the portion of the alignment mark further comprising a stack structure that comprises a plurality of first stack layers and a plurality of second stack layers being alternately stacked,
   the second dielectric material being surrounded by the stack structure, and
   a top surface of the portion of the alignment mark being below a top surface of the first dielectric material.

10. The semiconductor device according to claim 9, further comprising:
    a third stack layer and a fourth stack layer that are alternately stacked over the semiconductor layer; and
    a bottom select gate (BSG) cut structure including the second dielectric material, extending through the third stack layer and fourth stack layer.

11. The semiconductor device according to claim 10, wherein the alignment mark and BSG cut structure are filled with the second dielectric material at the same time.

12. The semiconductor device according to claim 9, wherein the portion of the alignment mark is formed in a non-functional region.

13. The semiconductor device according to claim 10, wherein an entire structure of the portion of the alignment mark is formed between a level of the semiconductor layer and a level of the third stack layer or fourth stack layer.

14. The semiconductor device according to claim 9, wherein the plurality of first stack layers includes a dielectric material and the plurality of second stack layers includes another dielectric material.

15. The semiconductor device according to claim 10, wherein one of the third stack layer and the fourth stack layer is a conductive stack layer.

16. The semiconductor device according to claim 10, further comprising:
    a conductor/insulator stack including a conductive stack layer and a dielectric stack layer alternately stacked, formed over the fourth stack layer; and
    a functional layer and a semiconductor channel, extending through the conductor/insulator stack, the functional layer formed between the semiconductor channel and the conductor/insulator stack.

17. A three-dimensional (3D) memory device, comprising:
    a semiconductor layer including a semiconductor material;
    a conductive layer including a conductive material formed over the semiconductor layer;
    a conductor/insulator stack formed over the conductive layer; and
    a structure of an alignment mark formed between the semiconductor layer and a dielectric layer, and between a level of the conductive layer and a level of the semiconductor layer, and extending partially through the semiconductor layer.

18. The 3D memory device according to claim 17, further comprising:
    a bottom select gate (BSG) cut structure, wherein the BSG cut structure extends through the conductive layer.

19. The 3D memory device according to claim 17, wherein
    the alignment mark comprises: a first stack layer and a second stack layer alternately stacked.

20. The 3D memory device according to claim 18, wherein the alignment mark and BSG cut structure are formed by depositing a dielectric material at the same time.

\* \* \* \* \*